United States Patent
Chiba

(10) Patent No.: US 7,248,480 B2
(45) Date of Patent: Jul. 24, 2007

(54) SEMICONDUCTOR ELEMENT, MANUFACTURING METHOD THEREOF, AND HIGH FREQUENCY INTEGRATED CIRCUIT USING THE SEMICONDUCTOR ELEMENT

(75) Inventor: Tadashi Chiba, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/056,280

(22) Filed: Feb. 14, 2005

(65) Prior Publication Data

US 2005/0184357 A1    Aug. 25, 2005

(30) Foreign Application Priority Data

Feb. 20, 2004    (JP)    ............... 2004-044789

(51) Int. Cl.
    *H01R 9/00*    (2006.01)
(52) U.S. Cl. .................. 361/776; 361/760; 336/200
(58) Field of Classification Search ................ 361/760; 336/200, 69, 223, 232; 333/160; 257/279–282
    See application file for complete search history.

(56) References Cited

U.S. PATENT DOCUMENTS 4,156,249 A * 5/1979 Koo ........................... 257/298
6,498,556 B2  12/2002 Iida et al.
6,583,704 B2   6/2003 Iida et al.
6,864,780 B2 * 3/2005 Doi et al. ................ 340/5.64

FOREIGN PATENT DOCUMENTS

| JP | 05291595 A | * 11/1993 |
|---|---|---|
| JP | 2001-291615 | 10/2001 |
| JP | 2001-291616 | 10/2001 |
| JP | 2002-124638 | 4/2002 |
| JP | 2003-179146 | 6/2003 |

* cited by examiner

*Primary Examiner*—Tuan Dinh
(74) *Attorney, Agent, or Firm*—Rabin & Berdo PC

(57) ABSTRACT

A semiconductor element comprises a capacitance variable section and an inductor section. In the capacitance variable section, a variable capacitance diode equipped with first and second control electrodes is provided on an insulative substrate. The inductor section is formed on the capacitance variable section formed with the variable capacitance diode. The inductor section is formed in an insulating layer provided on the variable capacitance diode. A first input/output electrode, a second input/output electrode, and first and second control input/output electrodes are provided in exposed form on the upper side of the insulating layer provided on the capacitance variable section. Further, a turbinated spiral electrode that electrically connects the first input/output electrode and the second input/output electrode, a first control lead-out electrode that electrically connects between the first control electrode and the first control input/output electrode, and a second control lead-out electrode that electrically connects between the second control electrode and each second control input/output electrode, are provided within the insulating layer.

14 Claims, 23 Drawing Sheets

VARIABLE SPIRAL INDUCTOR (PART 1) OF FIRST

VARIABLE SPIRAL INDUCTOR (PART 1) OF FIRST

VARIABLE SPIRAL INDUCTOR (PART 2) OF FIRST

MANUFACTURING PROCESS VIEW (PART 1) OF VARIABLE SPIRAL INDUCTOR OF FIRST EMBODIMENT

MANUFACTURING PROCESS VIEW (PART 2) OF VARIABLE
SPIRAL INDUCTOR OF FIRST EMBODIMENT

MANUFACTURING PROCESS VIEW (PART 3) OF VARIABLE SPIRAL INDUCTOR OF FIRST EMBODIMENT

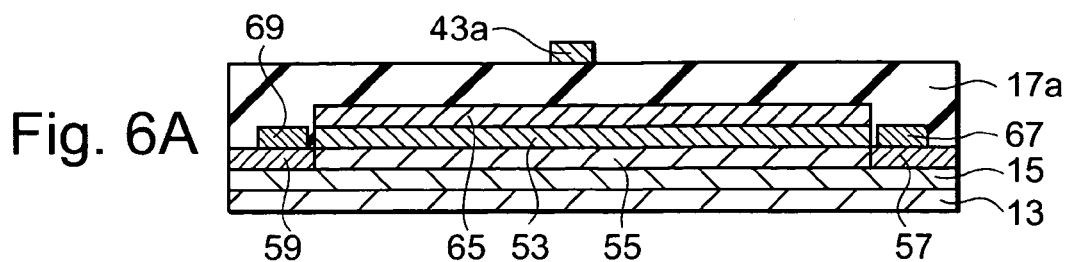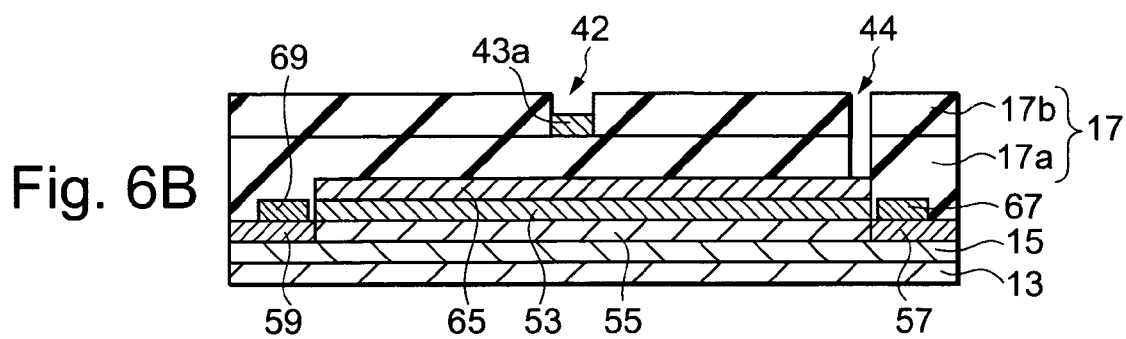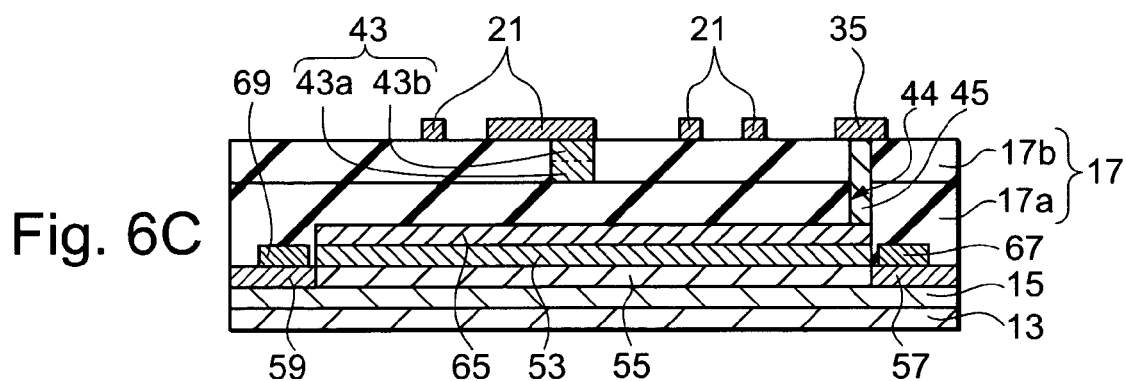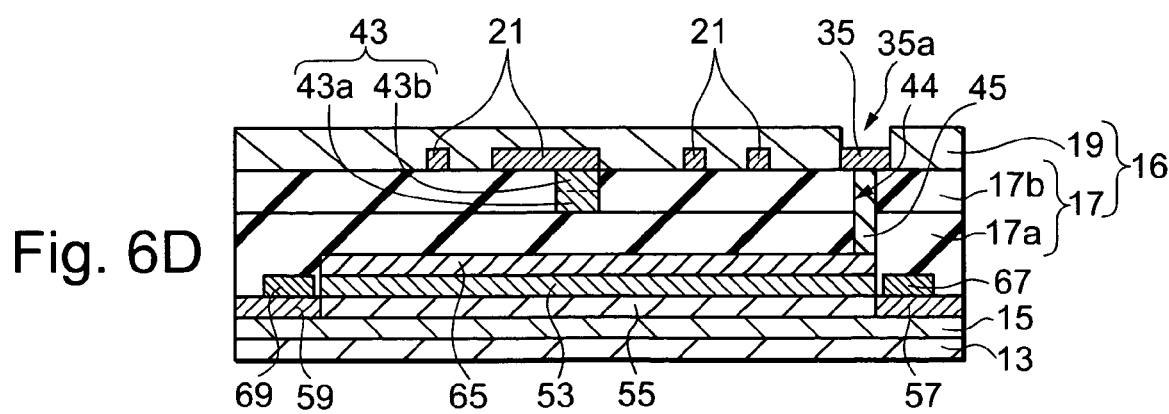
MANUFACTURING PROCESS VIEW (PART 4) OF VARIABLE SPIRAL INDUCTOR OF FIRST EMBODIMENT

EQUIVALENT CIRCUIT MODEL OF VARIABLE SPIRAL INDUCTOR
OF FIRST EMBODIMENT

CAPACITANCE CHARACTERISTIC OF VARIABLE
SPIRAL INDUCTOR OF FIRST EMBODIMENT

INDUCTANCE CHARACTERISTIC OF VARIABLE
SPIRAL INDUCTOR OF FIRST EMBODIMENT

FREQUENCY CHARACTERISTIC OF VARIABLE SPIRAL INDUCTOR
OF FIRST EMBODIMENT

VARIABLE SPIRAL INDUCTOR (PART 1) OF SECOND EMBODIMENT

VARIABLE SPIRAL INDUCTOR (PART 2) OF SECOND EMBODIMENT

MANUFACTURING PROCESS VIEW (PART 1) OF VARIABLE
SPIRAL INDUCTOR OF SECOND EMBODIMENT

MANUFACTURING PROCESS VIEW (PART 2) OF VARIABLE
SPIRAL INDUCTOR OF SECOND EMBODIMENT

EQUIVALENT CIRCUIT MODEL OF VARIABLE SPIRAL INDUCTOR OF SECOND EMBODIMENT

CAPACITANCE CHARACTERISTIC OF VARIABLE SPIRAL
INDUCTOR OF FIRST AND SECOND EMBODIMENT

FREQUENCY CHARACTERISTIC OF VARIABLE SPIRAL INDUCTOR OF SECOND EMBODIMENT

CIRCUIT CONFIGURATION OF LC-VCO

VARIABLE CAPACITANCE CONTROL VOLTAGE OF LC CIRCUIT [V]
VCO OSCILLATION FREQUENCY CHARACTERISTIC

PRIOR ART

PRIOR ART

SEMICONDUCTOR ELEMENT, MANUFACTURING METHOD THEREOF, AND HIGH FREQUENCY INTEGRATED CIRCUIT USING THE SEMICONDUCTOR ELEMENT

BACKGROUND OF THE INVENTION

1. Field of the Invention

The present invention relates to a semiconductor element, a manufacturing method thereof, and a high frequency integrated circuit using the semiconductor element.

2. Description of the Related Art

A device using a microwave has recently been in widespread use in applications such as mobile communications. The development of microwave integrated circuits (MICs) each installed in the device has been pursued. Of the MICs, a monolithic MIC (MMIC) in which active and passive elements are simultaneously fabricated and built onto a semiconductor substrate, has the advantage that since the monolithic MIC can be manufactured massively and uniformly according to a semiconductor process, it is excellent in productivity and reproducibility and easy to make its reductions in size and weight, for example.

Inductor elements (hereinafter might be called simply "inductors") are components important to an electric circuit and might be often essential thereto in view of its configuration. Since a spiral inductor of the inductors can be integrated into MMIC, it is of a general element as an inductor fabricated on a semiconductor substrate.

A prior art example of a spiral inductor will be explained with reference to FIG. 21. FIG. 21(A) is a schematic plan view of the conventional spiral inductor provided on an SOI substrate as viewed from its upper side. FIG. 21(B) is a cross-sectional view taken along line A-A shown in FIG. 21(A). FIG. 21(C) is a cross-sectional view taken along line C-C shown in FIG. 21(A). An insulative buried oxide film 215 exists between a support substrate 213 and an insulating layer 216. Electrodes for the spiral inductor 211 are formed in the insulating layer 216. The electrodes for the spiral inductor 211 comprise a first input/output electrode 231, a spiral electrode 221, a spiral electrode lead-out electrode 243 and a second input/output electrode 233 electrically connected in this order. The spiral electrode 221 is shaped in a turbinated spiral form.

The spiral inductor is used to adjust or control the impedance of an input/output section of a high frequency circuit, for example (refer to, for example, a patent document (Japanese Unexamined Patent Publication No. 2002-124638 (sections 0024 through 0026 and FIG. 1)). In the high frequency circuit, the accuracy of such impedance control exerts a great influence on the characteristic of the whole high frequency circuit.

In order to obtain the characteristic of the spiral inductor 211 by simulation, it is possible to carry out three-dimensional simulation from the structure of such a spiral inductor 211 as shown in FIG. 21. The three-dimensional simulation, however, needs enormous amounts of time. In view of this point, a simplified equivalent circuit is normally made up and circuit simulation is effected on the equivalent circuit. An equivalent circuit model of the spiral inductor for circuit simulation is shown in FIG. 22. In FIG. 22, Rs21, Ls21 and Cs21 indicate the value of a resistance of the spiral electrode 221, the value of an inductance thereof and the value of a capacitance thereof, respectively. Cins21 and Cins22 indicate the values of capacitances of the insulating layer 216, Cox21 and Cox22 indicate the values of capacitances of the buried oxide film 215, Csub21 and Csub22 indicate the values of capacitances of the support substrate 213, and Rsub21 and Rsub22 indicate the values of resistances of the support substrate 213, respectively. Incidentally, it is considered that a plurality of paths connect among the electrodes constituting the spiral inductor 211 and a ground point (called GND) so as to extend from respective portions of the electrodes constituting the spiral inductor 211 to GND.

FIG. 22 shows an equivalent circuit model connected to the substrate 213 from two points between the first input/output electrode 231 and the spiral electrode 221 and between the second input/output electrode 233 and the spiral electrode 221.

The value Ls21 of the inductance of the spiral inductor 211 is generally determined depending on the size and winding number or the like of the spiral electrode 221. However, when the whole spiral inductor 211 is considered, the value of the inductance thereof is affected by the inductances of internal and external wirings of the spiral inductor 211, which are connected to the spiral electrode 221, for example. Thus, the value Ls21 of the inductance has a certain degree of deviation.

Therefore, there has been proposed such a variable spiral inductor that the value Ls21 of the inductance can be adjusted after the formation of the spiral inductor 211 (refer to, for example, each of patent documents 2 (Japanese Unexamined Patent Publication No. 2001-291615), 3 (Japanese Unexamined Patent Publication No. 2001-291616) and 4 (Japanese Unexamined Patent Publication No. 2003-179146)).

A prior art example of a variable spiral inductor will be explained with reference to FIGS. 23 and 24 (refer to the patent document 2). FIG. 23 shows an equivalent circuit model of the variable spiral inductor. The equivalent circuit shown in FIG. 23 is different from the equivalent circuit shown in FIG. 22 only in components that constitute a spiral electrode 321. Other components are identical in configuration to those described with reference to FIG. 22. The variable spiral inductor is a circuit which adjusts or controls the value Rs31 of a resistance of the spiral electrode 321, the value Ls31 of its inductance and the value Cs31 of its capacitance.

FIG. 24 is a schematic plan view of the variable spiral inductor 311 as viewed from its upper side. Since its sectional view is similar to FIG. 21(B), the illustration of its section and the description thereof will be omitted. Electrodes for the variable spiral inductor 311 comprise a first input/output electrode 331, a first spiral electrode 321a, a trimming section 323, a second spiral electrode 321b and a second input/output electrode 333 electrically connected in this order. The first spiral electrode 321a, the trimming section 323 and the second spiral electrode 321b constitute a spiral electrode 321. The trimming section 323 comprises trimming electrodes 323a through 323e. The trimming electrodes 323a through 323e are respectively formed so as to connect the first spiral electrode 321a and the second spiral electrode 321b. The trimming electrodes 323a through 323e are cut one by one in order by irradiation thereof with a laser beam or the like to thereby change the value of the inductance of the variable spiral inductor 311.

However, the variable spiral inductor according to the above conventional example takes time and increases in cost because the value of its inductance is adjusted by a physical method that each electrode is cut, and encounters difficulties in adjusting the inductance with high accuracy. In order to control or adjust the inductance with high accuracy, it is important to fabricate a variable spiral inductor adjustable by voltage control without depending on physical control and build it onto an integrated circuit. However, an easy inductance control method has not yet proposed so far. Therefore, the application of the inductor to a receiving circuit section and a transmitting circuit section of a high frequency circuit is also limited. For example, the receiving circuit section of the high frequency circuit finds difficulty impedance-matching of input and output signals. Also the transmitting circuit section of the high frequency circuit finds it difficult to broaden a variable range of an oscillation frequency.

SUMMARY OF THE INVENTION

The present invention has been made in view of the foregoing problems. An object of the present invention is to provide a variable spiral inductor adjustable by voltage control as a semiconductor element, a method of manufacturing the same, and a high frequency integrated circuit using the variable spiral inductor.

According to one aspect of the present invention, for achieving the above object, there is provided a semiconductor element comprising a capacitance variable section and an inductor section. The capacitance variable section is configured so as to be provided, on an insulative substrate, with a variable capacitance diode equipped with first and second control electrodes.

The inductor section is formed on the capacitance variable section formed with the variable capacitance diode. The inductor section is formed in an insulating layer provided on the variable capacitance diode. First and second input/output electrodes and first and second control input/output electrodes are provided on the upper side of the insulating layer provided on the capacitance variable section, so as to be exposed respectively. Further, a turbinated spiral electrode that electrically connects the first input/output electrode and the second input/output electrode, a first control lead-out electrode that electrically connects between the first control electrode and the first control input/output electrode, and a second control lead-out electrode that electrically connects between the second control electrode and the second control input/output electrode, are provided within the insulating layer.

Upon implementation of the above semiconductor element, a silicon-on-insulator (SOI) substrate and a silicon-on-sapphire (SOS) substrate employed in a semiconductor integrated circuit are suitable for use as the insulative substrate.

According to the preferred embodiment of the above semiconductor element, a PN junction diode or a MOS diode may preferably be adopted as the variable capacitance diode.

According to the preferred embodiment of the semiconductor element of the present invention as well, the capacitance variable section may contain an MIM (Metal-Insulator-Metal) capacitance configured by sequentially laminating, over the first control electrode, a first metal electrode electrically connected to the first control electrode, an insulator layer and a second metal electrode electrically connected to the second control electrode.

Further, according to another preferred embodiment of the semiconductor element of the present invention, the capacitance variable section may contain a PIP (Polysilicon-Insulator-Polysilicon) capacitance configured by stacking, over the first control electrode, a first polycrystalline silicon electrode electrically connected to the first control electrode, an insulator layer, and a second polycrystalline silicon electrode electrically connected to the second control electrode in that order.

According to another aspect of the present invention, for achieving the above object, there is provided a method of manufacturing a semiconductor element, comprising the following steps. A semiconductor substrate is first prepared which is provided, over an insulating layer, a semiconductor layer with a gate region and high concentration diffused regions. Next, the semiconductor layer is doped with a first ion to change the semiconductor layer into an $n^-$ conduction type semiconductor layer according to a first ion implanting step. Next, a first control electrode is formed on a gate oxide film after the gate oxide film is formed on the gate region of the semiconductor layer. Next, each of the high concentration diffused regions of the semiconductor layer is doped with a second ion to change each of the high concentration diffused regions into an $n^+$ conduction type region according to a second ion implanting step with the first control electrode as a mask. A second control electrode is provided on the $n^+$ conduction type region to form a variable capacitance diode.

After the variable capacitance diode has been formed, a first insulating layer is provided on the variable capacitance diode. Next, an interlayer electrode is provided on the first insulating layer. A second insulating layer is provided on the first insulating layer and the interlayer electrode. Next, a spiral electrode is provided on the second insulating layer. Further, a spiral electrode opening and first and second control openings are defined in the first and second insulating layers.

Next, a first control lead-out electrode is provided in the first control opening, and a second control lead-out electrode is provided in the second control opening. And an electrode electrically connected to the interlayer electrode is provided in the spiral electrode opening to configure a spiral electrode lead-out electrode. Thereafter, a spiral electrode is provided over the second insulating layer so as to be electrically connected to the spiral electrode lead-out electrode. A first input/output electrode and a second input/output electrode electrically connected via the spiral electrode and the spiral electrode lead-out electrode, a first control input/output electrode electrically connected to the first control lead-out electrode, and a second control input/output electrode electrically connected to the second control lead-out electrode are provided on the second insulating layer.

Next, a protective film is provided on the second insulating layer. Thereafter, two or more openings are defined in the protective film to thereby expose the first input/output electrode, second input/output electrode, gate input/output electrode and variable capacitance control input/output electrode.

Upon implementation of the above semiconductor element manufacturing method, following the step for forming the variable capacitance diode, a fixed capacitance may preferably be provided which electrically connects the first control electrode and the second control electrode and is located on the first control electrode.

According to the preferred embodiment of the semiconductor element manufacturing method, a first metal electrode, an insulator layer and a second metal layer may preferably be formed in that order to bring the fixed capacitance to a laminated structure.

According to another embodiment of the semiconductor element manufacturing method, a first polycrystalline silicon electrode, an insulator layer and a second polycrystalline silicon electrode may preferably be formed in that order to bring the fixed capacitance to a laminated structure.

According to a further aspect of the present invention, for achieving the above object, there is provided a high frequency integrated circuit comprising a first-stage cascode amplifying section and a differential cascode amplifying section.

The first-stage cascode amplifying section is configured so as to include first and second N type MOSFETs, a first inductor, an input capacitor, a first output capacitor, first and second variable inductors and a first resistive component.

The differential cascode amplifying section is configured so as to include third, fourth, fifth and sixth N type MOSFETs, second third and fourth inductors, second and third output capacitors, third, fourth, fifth and sixth variable inductors, and second and third resistive components.

In the first-stage cascode amplifying section, a drain electrode of the first N type MOSFET is connected to a source electrode of the second N type MOSFET, and a drain electrode of the second N type MOSFET is connected to a power supply terminal through the first inductor. Further, the drain electrode of the second N type MOSFET is connected to the first output capacitor, a gate electrode of the second N type MOSFET is connected to the power supply terminal, and a source electrode of the first N type MOSFET is connected to a ground terminal through the second variable inductor.

The first resistive component comprises first and second resistive elements connected in series at a first connecting point between the power supply terminal and the ground terminal. A gate electrode of the first N type MOSFET is connected to the first connecting point between the first and second resistive elements through the first variable inductor, and an input terminal is connected to the first connecting point through the input capacitor.

Further, in the differential cascode amplifying section, a drain electrode of the third N type MOSFET is connected to a source electrode of the fourth N type MOSFET, and a drain electrode of the fourth N type MOSFET is connected to the power supply terminal through the second inductor. Further, the drain electrode of the fourth N type MOSFET is connected to a first output terminal through the second output capacitor, a gate electrode of the fourth N type MOSFET is connected to the power supply terminal, and a source electrode of the third N type MOSFET is connected to a source electrode of the fifty N type MOSFET through the fourth and sixth variable inductors connected in series. The second resistive component comprises third and fourth resistive elements connected in series between the power supply terminal and the ground terminal. A gate electrode of the third N type MOSFET is connected to a second connecting point between the third and fourth resistive elements through the third variable inductor, a drain electrode of the fifth N type MOSFET is connected to a source electrode of the sixth N type MOSFET, and a drain electrode of the sixth N type MOSFET is connected to the power supply terminal through the third inductor. Further, the drain electrode of the sixth N type MOSFET is connected to a second output terminal through the third output capacitor, and a gate electrode of the sixth N type MOSFET is connected to the power supply terminal. The third resistive component comprises fifth and sixth resistive elements connected in series between the power supply terminal and the ground terminal. A gate electrode of the fifth N type MOSFET is connected to a third connecting point between the fifth and sixth resistive elements through the fifth variable inductor. A fourth connecting point between the fourth and sixth variable inductors is connected to the ground terminal through a parallel circuit of the fourth inductor and a capacitor, and the second connecting point is connected to the first output capacitor.

Here, each of the first, second, third, fourth, fifth and sixth variable inductors may preferably use the above semiconductor element.

According to a still further aspect of the present invention, for achieving the above object, there is provided a high frequency integrated circuit comprising first and second P type MOSFETs, first, second, third, fourth and fifth N type MOSFETs, an inductor, a capacitor, and first and second control resistors.

Source electrodes of the first P type MOSFET and the second P type MOSFET are connected to a power supply terminal. A drain electrode of the first P type MOSFET is connected to a gate electrode of the second P type MOSFET, and a drain electrode of the second P type MOSFET is connected to a gate electrode of the first P type MOSFET. The inductor and the capacitor are connected in parallel between the drain electrode of the first P type MOSFET and the drain electrode of the second P type MOSFET.

The inductor comprises a fist variable inductor and a second variable inductor connected in series. The capacitor comprises a first variable capacitor and a second variable capacitor connected in series. A control voltage terminal is connected to a connecting point of the first and second variable capacitors.

The drain electrode of the first P type MOSFET is connected to a drain electrode of the first N type MOSFET and a gate electrode of the second N type MOSFET, the drain electrode of the second P type MOSFET is connected to a gate electrode of the first N type MOSFET and a drain electrode of the second N type MOSFET, and source electrodes of the first N type MOSFET and the second N type MOSFET are connected to a drain electrode of the third N type MOSFET.

A source electrode of the third N type MOSFET is connected to a ground terminal. A gate electrode of the third N type MOSFET is connected to a constant current circuit. The drain electrodes of the first and second P type MOSFETs are respectively connected to gate electrodes of the fourth and fifth N type MOSFETs.

Source electrodes of the fourth and fifth N type MOSFETs are respectively connected to first and second output terminals. The first and second output terminals are respectively connected to output control voltage terminals through the first and second control resistors. Drain electrodes of the fourth N type MOSFET and the fifth N type MOSFET are both connected to the ground terminal.

The first and second variable inductors may preferably use the above semiconductor element.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 6 is a process view (part 4) for describing the method of manufacturing the variable spiral inductor according to the first embodiment of the present invention;

DETAILED DESCRIPTION OF THE PREFERRED EMBODIMENTS

Preferred embodiments of the present invention will hereinafter be described with reference to the accompanying drawings. However, the drawings merely schematically show the size, shape and positional relationships of respective components to such a degree that the present invention can be understood. Although preferred configurational examples of the present invention are explained below, the composition (material) and numerical conditions of the respective components, etc. are simply preferred examples. Thus, the present invention is not limited only to the embodiments to be described below.

First Preferred Embodiment

Configuration of Semiconductor Element According to First Embodiment

A variable spiral inductor used as a semiconductor element according to a first embodiment comprises a capacitance variable section and an inductor section. The capacitance variable section includes a variable capacitance diode provided on an insulative substrate. A silicon-on-insulator (SOI) substrate or a silicon-on-sapphire (SOS) substrate may preferably be used as the insulative substrate. As an alternative to the SOI substrate or the SOS substrate, any of a silicon-on-quartz (SOQ) substrate, a strained SOI substrate, an sSGOI substrate formed with strained silicon on a silicon-germanium-on-insulator (SGOI) substrate, etc. may be used.

Figure 1A:
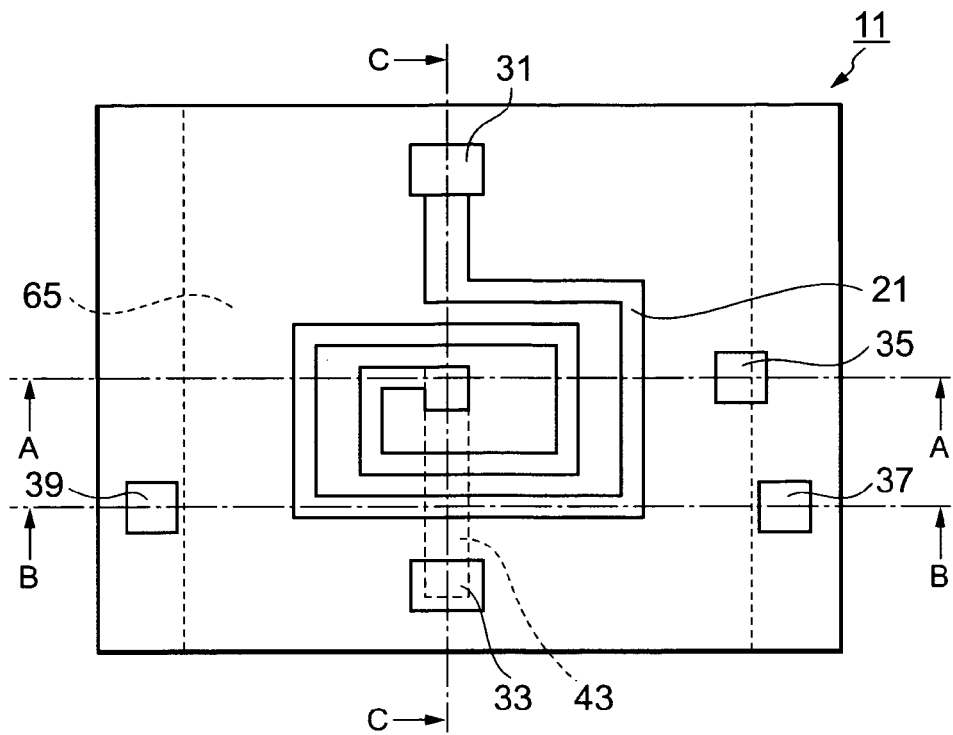
FIG. 1 is a view (part 1) for describing a configuration of a variable spiral inductor according to a first embodiment of the present invention.
Figure 1B:
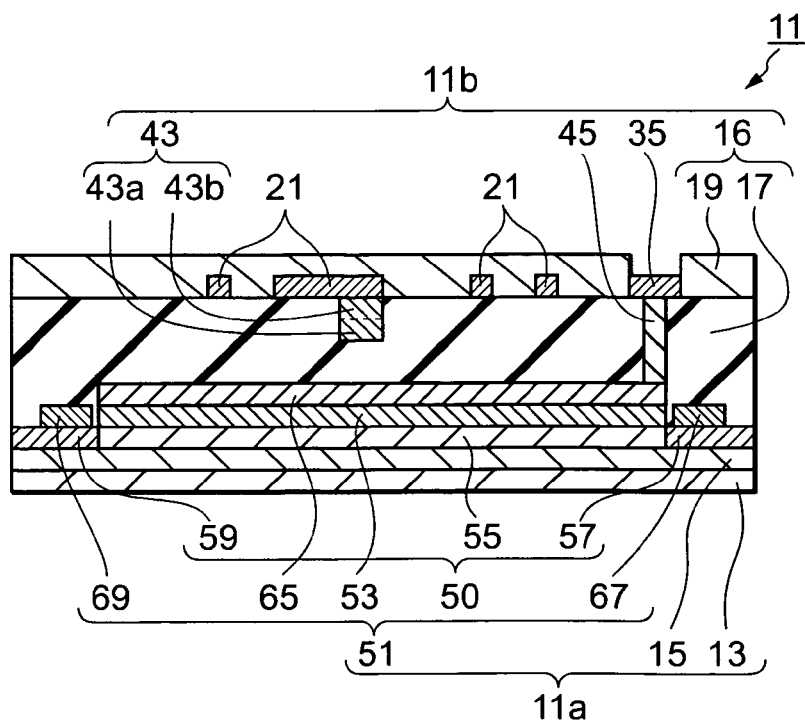
Figure 2A:
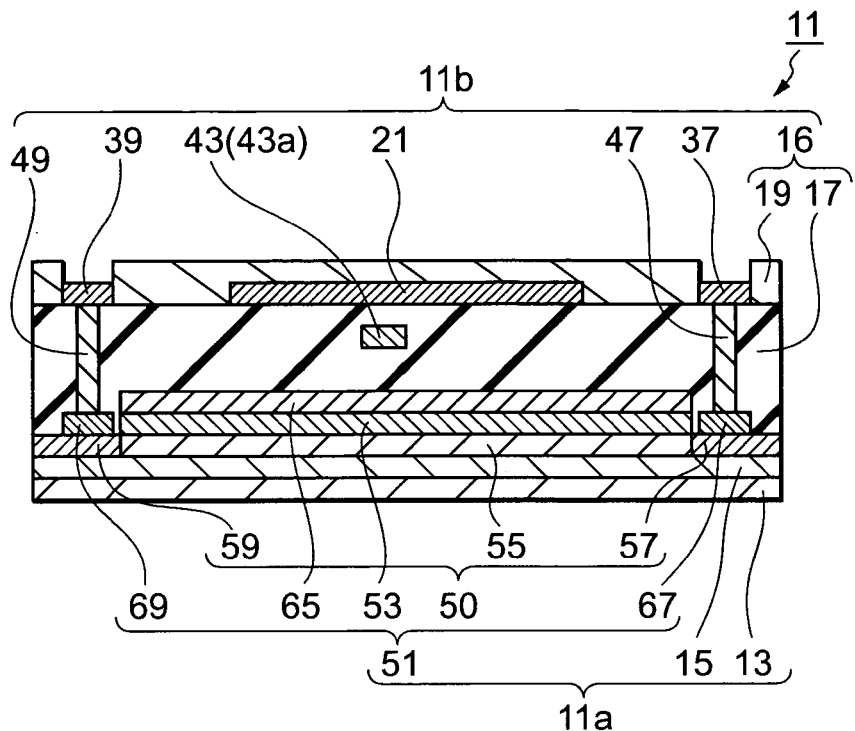
FIG. 2 is a view (part 2) for describing the configuration of the variable spiral inductor according to the first embodiment of the present invention.
Figure 2B:
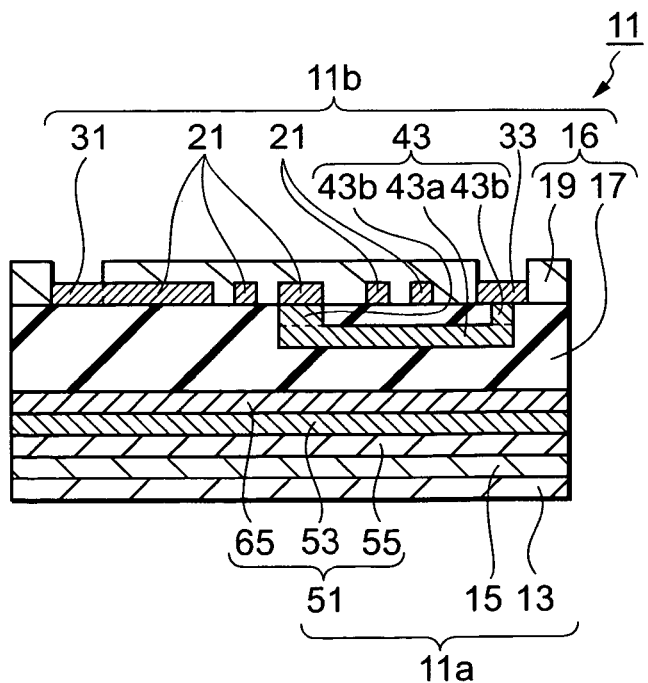

A configuration of the variable spiral inductor according to the first embodiment will be explained with reference to FIGS. 1 and 2. The present embodiment will explain a case in which the SOI substrate is used as the insulative substrate. FIG. 1(A) is a schematic plan view showing the variable spiral inductor provided on the SOI substrate in a state in which a protective film thereof has been omitted. FIG. 1(B) is a cross-sectional view taken along line A-A shown in FIG. 1(A). FIG. 2(A) is a cross-sectional view taken along line B-B shown in FIG. 1(A). FIG. 2(B) is a cross-sectional view taken along line C-C shown in FIG. 1(A).

The SOI substrate comprises a support substrate 13 and an insulative buried oxide film 15 provided on the support substrate 13, and a silicon layer 50 corresponding to a semiconductor layer, which is provided on the buried oxide film 15. The silicon layer 50 includes a gate region 55 and first and second high-concentration diffused regions 57 and 59.

In the present configuration example, the variable capacitance diode 51 comprises the gate region 55, the first and second high-concentration diffused regions 57 and 59, a gate oxide film 53, a gate electrode 65 and first and second variable capacitance control electrodes 67 and 69. Although a MOS diode or a PN junction diode can be used as the variable capacitance diode 51, an example using the MOS diode will be explained here. The gate region 55 formed in the silicon layer 50 is doped with an n-type impurity like, for example, As so as to assume an n$^-$ conduction type. The first and second high-concentration diffused regions 57 and 59 are doped with the n-type impurity like, for example, As in a concentration higher than the gate region 55 so as to take an n+ conduction type region. The gate oxide film 53 is formed on the gate region 55, and the gate electrode 65 is formed on the gate oxide film 53 as a first control electrode. The first and second variable capacitance control electrodes 67 and 69 are respectively formed on the first and second high-concentration diffused regions 57 and 59 as second control electrodes.

An inductor section 11b is formed over a capacitance variable section 11a comprising the support substrate 123, the buried oxide film 15 and the variable capacitance diode 51. The inductor section 11b is formed in an insulating layer 16 composed of an interlayer insulating film 17 provided over the capacitance variable section 11a and a protective film 19 provided on the interlayer insulating film 17. A gate input/output electrode 35 is provided as a first control input/output electrode so as to be exposed on the upper side of the insulating layer 16, and first and second variable capacitance control input/output electrodes 37 and 39 are provided as second control input/output electrodes so as to be exposed on the upper side of the insulating layer 16, respectively. The gate input/output electrode 35 is electrically connected to the gate electrode 65 via a gate lead-out electrode 45 used as a first control lead-out electrode provided within the interlayer insulating film 17. The first and second variable capacitance control input/output electrodes 37 and 39 are respectively electrically connected to the first and second variable capacitance control electrodes 67 and 69 via first and second variable capacitance lead-out electrodes 47 and 49 used as second control lead-out electrodes provided within the interlayer insulating film 17.

Further, first and second input/output electrodes 31 and 33 are respectively provided with being exposed on the upper side of the insulating layer 16. The first and second input/output electrodes 31 and 33 are electrically connected to each other via a spiral electrode 21 and a spiral electrode lead-out electrode 43. The spiral electrode lead-out electrode 43 comprises an interlayer electrode 43a and a lead-out electrode 43b. According to the design, a structure may be adopted wherein the first and second input/output electrodes 31 and 33 are directly connected to both ends of the spiral electrode 21, and the spiral electrode lead-out electrode 43 is not provided. In the configurational example of the present embodiment, the first and second variable capacitance control input/output electrodes 37 and 49 are provided as the second control input/output electrodes. However, if the first and second variable capacitance control electrodes 67 and 69 are formed so as to be electrically connected to each other, then only the first variable capacitance lead-out electrode 47 and the first variable capacitance control input/output electrode 37 may be provided without providing the second variable capacitance lead-out electrode 49 and the second variable capacitance control input/output electrode 39.

Although the present embodiment has explained such a configuration that the first and second input/output electrodes 31 and 33, the gate input/output electrode 35 and the first and second variable capacitance control input/output electrodes 37 and 39 are exposed through openings defined in the protective film 19, these input/output electrodes 31, 33, 35, 37 and 39 may be provided in protruded form on the surface of the protective film 19 according to the design.

Method of Manufacturing Semiconductor Element According to First Embodiment

A method of manufacturing the variable spiral inductor according to the first embodiment will be explained with reference to process views for describing a method of manufacturing a variable spiral inductor shown in FIGS. 3 through 6. FIGS. 3(A) through 3(D) and FIGS. 4(A) through 4(D) are process views corresponding to FIG. 1(A), of the variable spiral inductor as viewed from thereabove. FIGS. 5(A) through 5(D) and FIGS. 6(A) through 6(D) are respectively process views of the variable spiral inductor as viewed in a section taken along line A-A shown in FIG. 1(A).

Figure 3A:
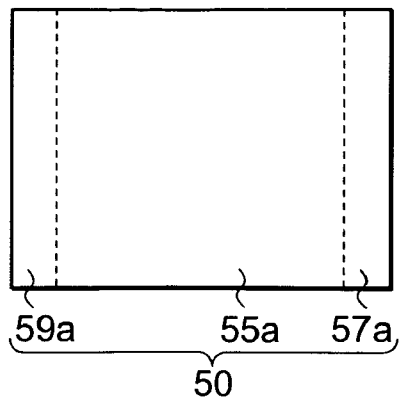
FIG. 3 is a process view (part 1) for describing a method of manufacturing the variable spiral inductor according to the first embodiment of the present invention.
Figure 3B:
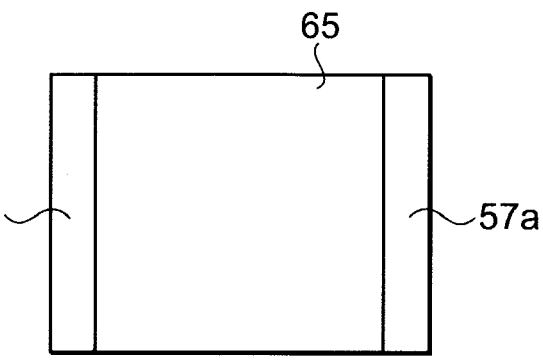
Figure 3C:
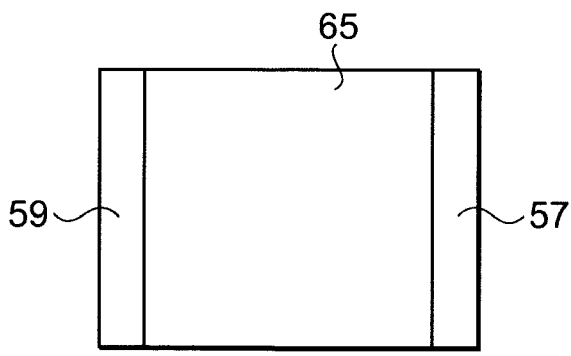
Figure 3D:
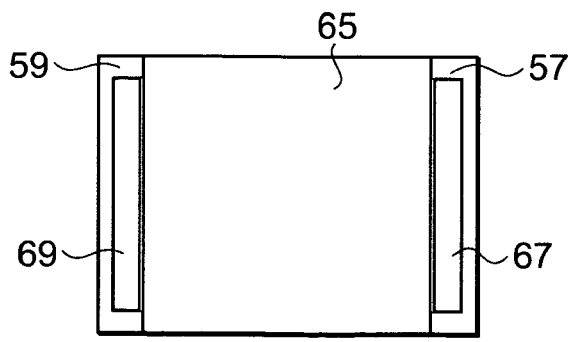
Figure 5A:
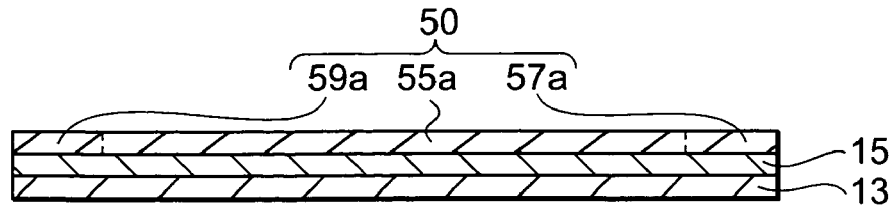
FIG. 5 is a process view (part 3) for describing the method of manufacturing the variable spiral inductor according to the first embodiment of the present invention.
Figure 5B:
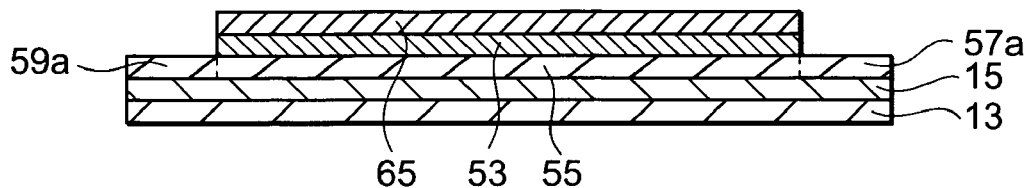
Figure 5C:
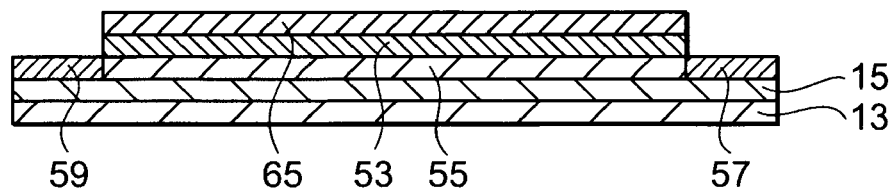
Figure 5D:
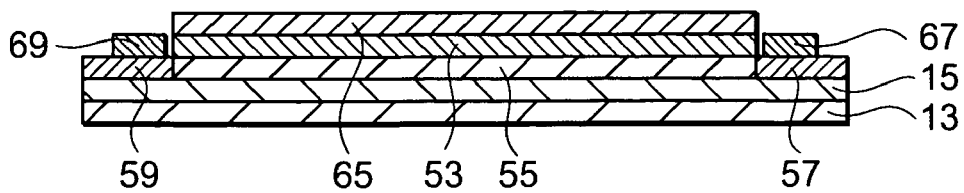

An SOI substrate composed of a support substrate 13, an insulative buried oxide film 15 provided on the support substrate 13, and a silicon layer 50 corresponding to a semiconductor layer, which is provided on the buried oxide film 15, is first prepared (see FIG. 3(A) and FIG. 5(A)). The silicon layer 50 includes, in advance, a gate scheduled region 55a used as a region whose surface is formed with a gate electrode, and first and second high-concentration diffused scheduled regions 57a and 59a whose surfaces are formed with first and second variable capacitance control electrodes 67 and 69 respectively.

Next, the silicon layer 50 of the SOI substrate is ion-implanted to change it into an $n^-$ conduction type semiconductor layer. The ion implantation is performed by doping the silicon layer 50 with an n-type impurity such as As as a first ion. The concentration of the $n^-$ impurity can be set where necessary. The settable range of the capacitance of the variable capacitance diode is determined depending on the concentration of the $n^-$ impurity. It may be feasible to dope the silicon layer 50 with a p type impurity such as $BF_2$ as an alternative to the n type impurity and thereby change the silicon layer 50 into a $p^-$ conduction type semiconductor layer.

Next, a gate oxide film 53 is formed on the gate scheduled region 55a of the silicon layer 50 corresponding to the $n^-$ conduction type semiconductor layer. The gate oxide film can be formed by the known thermal oxidation method. Next, a gate electrode 65 is formed on the gate oxide film 53 as a first control electrode by using a sputtering and etching technique. The gate electrode may preferably be formed by sputtering aluminum. The method of forming the gate oxide film 53 and the gate electrode 65 is not limited to the above method. The known method used in the manufacture of MOSFETs may be adopted. The gate electrode 65 may be formed of a conductive material corresponding to the design, such as copper, polycrystalline silicon or the like. Owing to the formation of the gate oxide film 53 and the gate electrode 65, the gate scheduled region 55a serves as a gate region 55 (see FIG. 3(B) and FIG. 5(B)).

In order to change the first and second high-concentration diffused scheduled regions 57a and 59a into $n^+$ conduction type regions, respectively, after the formation of the gate electrode 65, their change is done by ion-implantation with the gate electrode 65 as a mask. In the present ion implantation, they are doped with, for example, the n-type impurity such as As as a second ion in a concentration higher than that of the first ion. With the implantation of the second ion, the first and second high-concentration diffused scheduled regions 57a and 59a result in first and second high-concentration diffused regions 57 and 59. Thus, the first and second high-concentration diffused regions 57 and 59 are defined in the silicon layer 50 (see FIG. 3(C) and FIG. 5(C)).

Thereafter, the first and second variable capacitance control electrodes 67 and 69 are respectively formed on the first and second high-concentration diffused regions 57 and 59 each corresponding to the $n^+$ conduction type region as second control electrodes by using the sputtering and etching technique. The first and second variable capacitance control electrodes 67 and 69 may be formed by, for example, sputtering aluminum or an arbitrary suitable method wherein a high melting-point metal layer is formed and thereafter brought into silicidation, for example (see FIG. 3(D) and FIG. 5(D)). Owing to the formation of the first and second variable capacitance control electrodes 67 and 69, a variable capacitance diode 51 is constituted which includes the gate region 55, the first and second high-concentration diffused regions 57 and 59, the gate oxide film 53, the gate electrode 65, and the first and second variable capacitance control electrodes 67 and 69.

A first insulating layer 17a is provided on the silicon layer 50 formed with the variable capacitance diode 51. The first insulating layer 17a is formed of an oxide film by a CVD method, for example. Next, an interlayer electrode 43a is formed on the first insulating layer 17a by using the sputtering and etching technique. The interlayer electrode 43a may preferably be formed of aluminum, for example (see FIG. 4(A) and FIG. 6(A)).

A second insulating layer 17b is formed on the first insulating layer 17a on which the interlayer electrode 43a is formed. The second insulating layer 17b is formed as an oxide film by the CVD method, for example. The first insulating layer 17a and the second insulating layer 17b might be called "interlayer insulating film 17" in combination below. An opening 44 for the gate electrode, openings 46 and 48 for the first and second variable capacitance control electrodes, and an opening 42 for the spiral electrode are defined in the interlayer insulating film 17. The formation of these openings is performed by, for example, the known photolitho/etching (see FIG. 4(B) and FIG. 6(B)). In the present configurational example, the opening 44, the opening 46 and the opening 48 are provided as holes extending through the interlayer insulating film 17 in such a way as to expose the top face of the gate electrode 65, expose the top face of the first variable capacitance control electrode 67 and expose the top face of the second variable capacitance control electrode 69 therethrough respectively. On the other hand, the opening 42 for the spiral electrode is provided as a hole which extends to some midpoint in the interlayer insulating film 17, i.e., a depth at which the top face of the interlayer insulating film 43a is exposed.

A gate lead-out electrode 45 electrically connected to the gate electrode 65 is formed in the opening 44. First and second variable capacitance lead-out electrodes 47 and 49 respectively electrically connected to the first and second variable capacitance control electrodes 67 and 69 are formed in their corresponding openings 46 and 48. The gate lead-out electrode 45, the first variable capacitance lead-out electrode 47 and the second variable capacitance lead-out electrode 49 are respectively formed by embedding a metal such as tungsten into the opening 44, the opening 46 and the opening 48 by the CVD method, for example.

A lead-out electrode 43b is formed in the opening 42 so as to be electrically connected to the interlayer electrode 43a and serves as a spiral electrode lead-out electrode 43 in cooperation with the interlayer electrode 43a. The spiral electrode lead-out electrode 43 is formed by using the spurring and etching technique, for example. An electrode material therefor may preferably be aluminum.

In the case of such design that no spiral electrode lead-out electrode 43 is provided, the first insulating layer 17a and the second insulating layer 17b may be formed in the same process as the integral interlayer insulating film 17.

A spiral electrode 21 electrically connected to one end of the spiral electrode lead-out electrode 43 is provided on the second insulating layer 17. In the present configurational example, the spiral electrode 21 is formed on the second insulating layer 17b but may be formed so as to be embedded into the second insulating layer 17b. The width and winding number of the spiral electrode 21 can arbitrarily be set in such a manner that the inductance of the spiral electrode 21 reaches a predetermined inductance range. Also the shape of the spiral electrode 21 and the size of its occupied area, etc. can arbitrarily be set according to the design. The spiral electrode 21 is formed using, for example, the sputtering and etching technique. Further, a gate input/output electrode 35, first and second variable capacitance control input/output electrodes 37 and 39, and first and second-input/output electrodes 31 and 33 are formed in the same process as that for the formation of the spiral electrode 21. An electrode material may be aluminum. These input/output electrodes are shaped in the form of bonding pads normally used in the semiconductor element (see FIG. 4(C) and FIG. 6(C)).

Figure 4A:
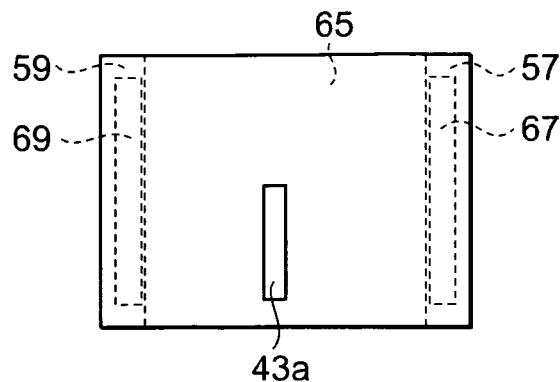
FIG. 4 is a process view (part 2) for describing the method of manufacturing the variable spiral inductor according to the first embodiment of the present invention.
Figure 4B:
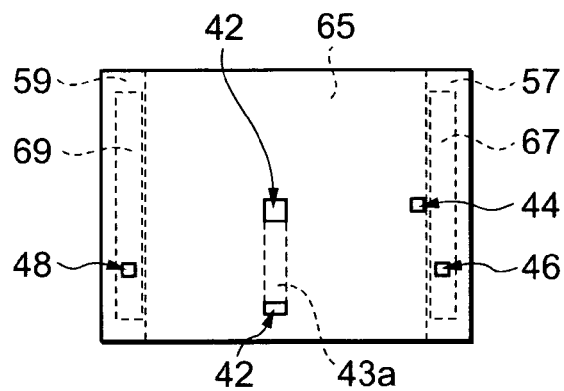
Figure 4C:
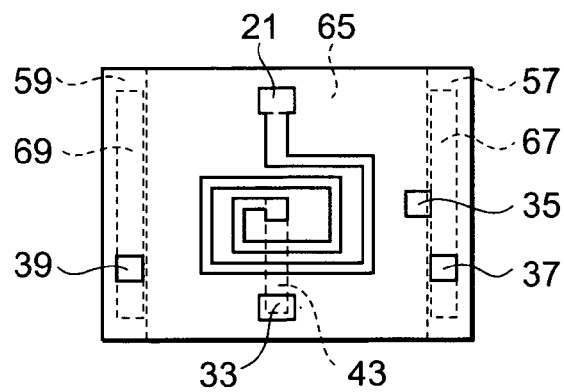
Figure 4D:
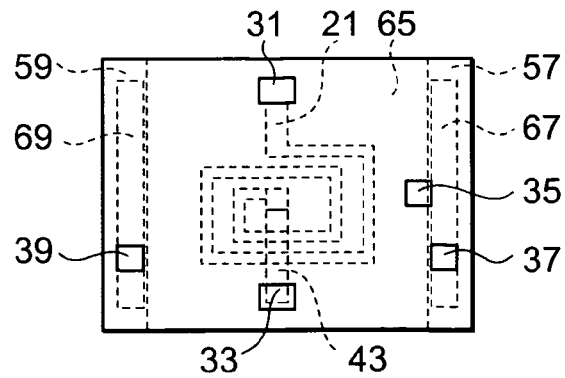

A protective film 19 is formed on the second insulating layer 17b. The interlayer insulating film 17 and the protective film 19 might be called an insulating layer 16 in combination. Openings for respectively exposing the surfaces of the gate lead-out electrode 45, the first and second variable capacitance lead-out electrodes 47 and 49, the spiral electrode 21 and the spiral electrode lead-out electrode 43 are defined in the protective film 19 to thereby expose the gate input/output electrode 35, the first and second variable capacitance control input/output electrodes 37 and 39, and the first and second input/output electrodes 31 and 33 (see FIG. 4(D) and FIG. 6(D)). In FIG. 4(D), the protective film 19 and the openings are not illustrated in the drawings. The opening 35a for the gate input/output electrode, of these openings is shown in FIG. 6(D).

The first input/output electrode 31 and the second input/output electrode 33 are formed so as to be electrically series-connected to each other via the spiral electrode 21 and the spiral electrode lead-out electrode 43. Incidentally, when such a configuration that no spiral electrode lead-out electrode 43 is provided, is taken, the first input/output electrode 31 and the second input/output electrode 33 are connected to both ends fo the spiral electrode 21. Although the first and second variable capacitance control input/output electrodes 37 and 39 are provided as variable capacitance control input/output electrodes in the present embodiment, only the first variable capacitance lead-out electrode 47 and the first variable capacitance control input/output electrode 37 may be provided without providing the second variable capacitance lead-out electrode 49 and the second variable capacitance control input/output electrode 39 if the first and second variable capacitance control electrodes 67 and 69 are electrically connected to each other.

Operation of Semiconductor Element According to First Embodiment

Figure 7:
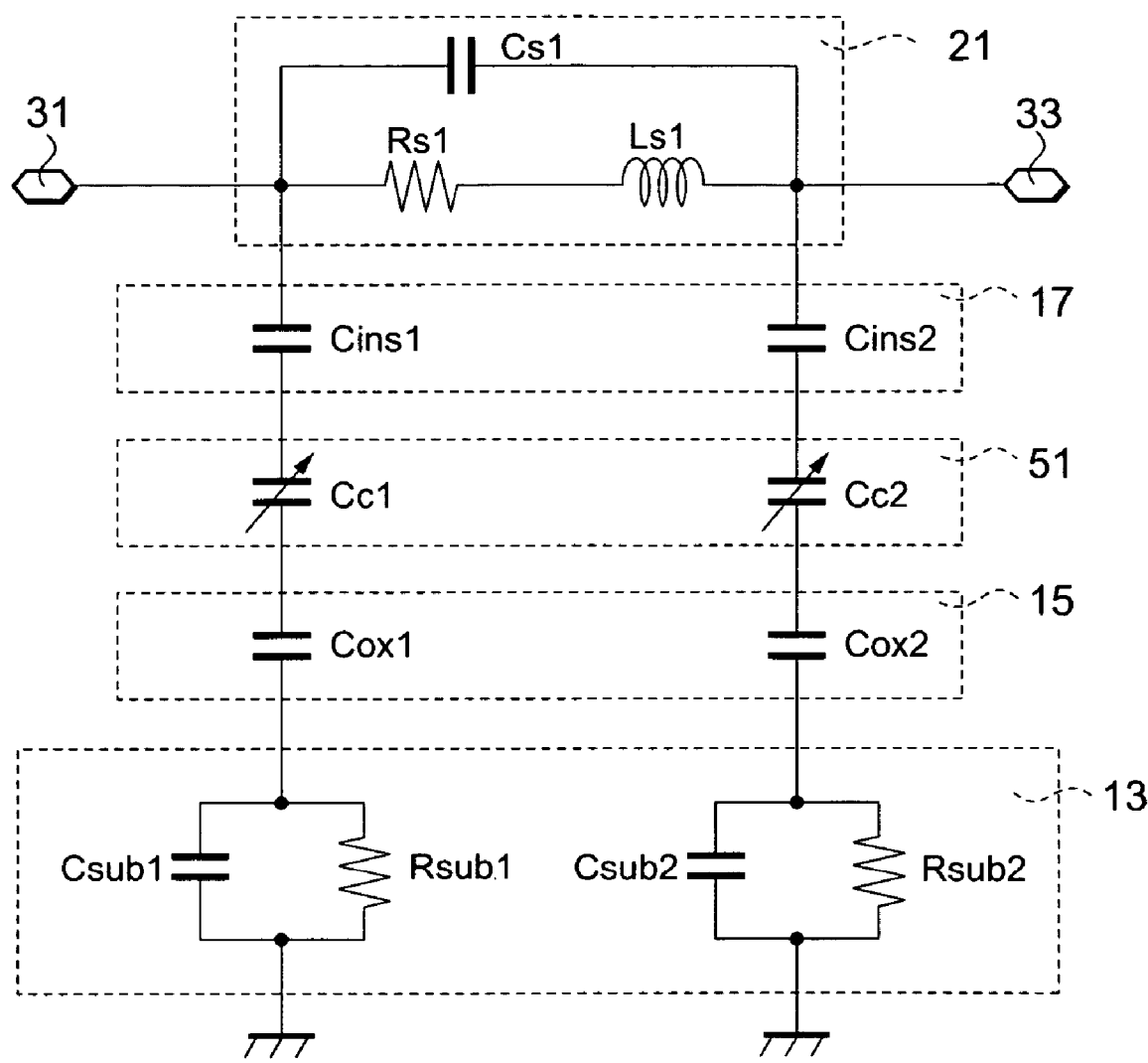
FIG. 7 is a view showing an equivalent circuit model of the variable spiral inductor according to the first embodiment of the present invention.

The operation of the variable spiral inductor according to the first embodiment will be explained with reference to FIG. 7. FIG. 7 is a view showing an equivalent circuit model of the variable spiral inductor according to the first embodiment.

Rs1, Ls1 and Cs1 respectively denote symbols indicative of resistance, inductance and capacitance of the spiral electrode 21. Cins1 and Cins2 denote symbols each indicative of capacitance of the interlayer insulating film 17, Cox1 and Cox2 denote symbols each indicative of capacitance of the buried oxide film 15, Csub1 and Csub2 denote symbols each indicative of capacitance of the support substrate 13, and Rsub1 and Rsub2 denote symbols each indicative of resistance of support substrate 13. Cc1 and Cc2 denote symbols each indicative of capacitance of the variable capacitance diode 51.

A control voltage applied to the variable capacitance diode 51 is changed to vary each capacitance of the variable capacitance diode 51. With the change in the capacitance of the variable capacitance diode 51, the inductance between the first input/output electrode 31 and the second input/output electrode 33 also changes. Incidentally, while it is considered that a plurality of paths connect among the electrodes constituting the variable spiral inductor 11 and ground points (called GND) so as to extend from the respective portions of the electrodes constituting the variable spiral inductor 11 to GND, FIG. 7 shows an equivalent circuit model which has taken into consideration both of the connection of the portion between the first input/output electrode 31 and the spiral electrode 21 and GND and the connection of the portion between the second input/output electrode 33 and the spiral electrode 21 and GND. While the capacitances of the variable capacitance diode 51 are being represented as Cc1 and Cc2 in the equivalent circuit model which has taken into consideration the two paths as described above, Cc1 and Cc2 both correspond to the capacitances contained in the variable capacitance diode 51 and change in sync with one control voltage.

Figure 8:
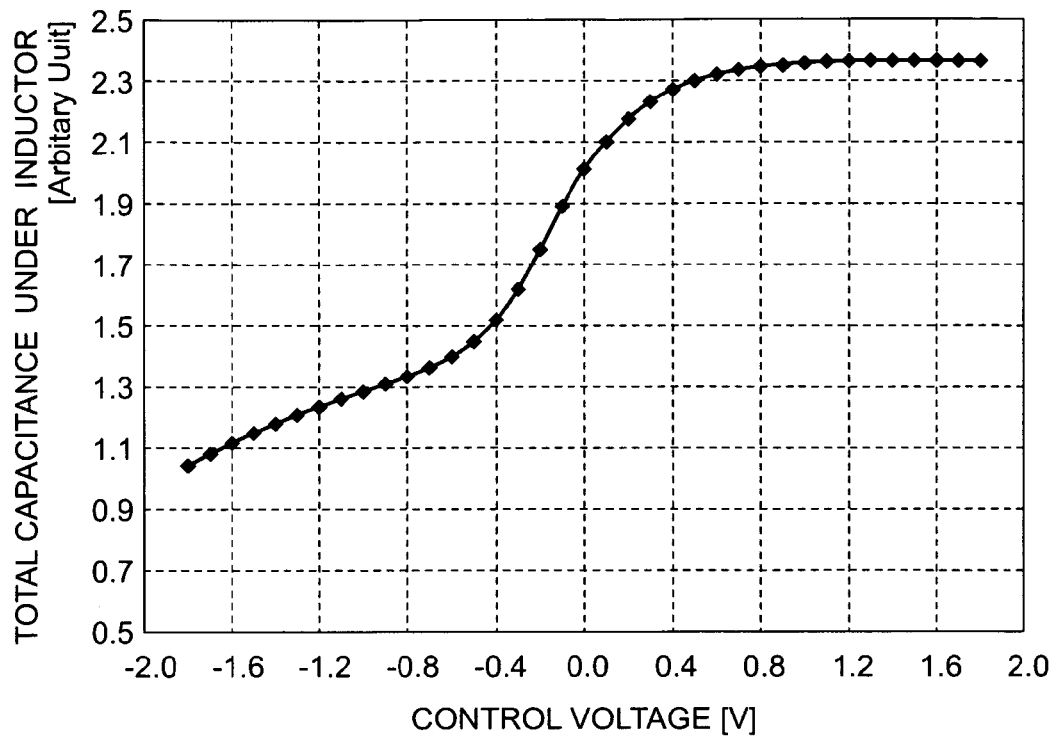
FIG. 8 is a view illustrating changes in the capacitance of the variable spiral inductor according to the first embodiment with respect to control voltages.

FIG. 8 is a view illustrating an example indicative of changes in the capacitance of the variable spiral inductor according to the first embodiment with respect to control voltages. The horizontal axis indicates the control voltage applied to the first variable capacitance control input/output electrode 37, and the vertical axis indicates the whole or total capacitance (arbitrary unit) of the variable spiral inductor 11, which is obtained by combining the capacitances of the interlayer insulating film 17, the variable capacitance diode 51 and the support substrate 13. Incidentally, the present embodiment will explain such a configurational example that the first and second variable capacitance control electrodes 67 and 69 are formed so as to be electrically connected to each other. Thus, the control voltage is simultaneously applied to the first and second variable capacitance control electrodes 67 and 69. When the control voltage is changed from −1.8V to 1.8V, the capacitance between an input/output terminal (e.g., the first input/output electrode 31) and GND, i.e., the capacitance of the variable spiral inductor changes in a range of 1.1 to 2.3. Within this range, the capacitance of the variable spiral inductor can be set according to the control voltage.

Figure 9:
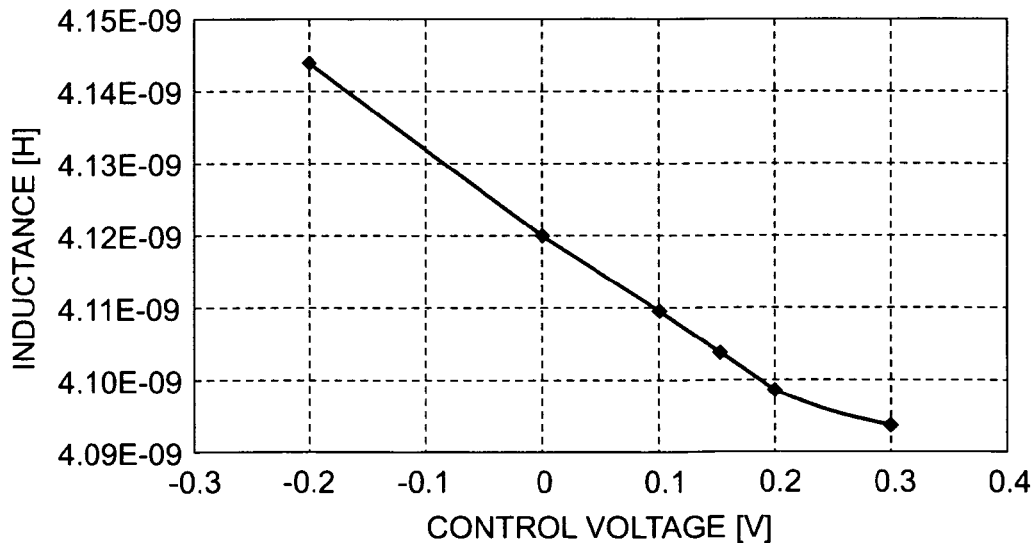
FIG. 9 is a view depicting changes in the inductance of the variable spiral inductor according to the first embodiment with respect to control voltages.

FIG. 9 is a view showing changes in the inductance of the variable spiral inductor according to the first embodiment with respect to control voltages. The horizontal axis indicates a control voltage applied to the first variable capacitance control input/output electrode 37, and the vertical axis indicates the inductance (H) between the first input/output electrode 31 and the second input/output electrode 33. The inductance (H) is determined depending on the capacitance of the variable spiral inductor. The capacitance of the variable spiral inductor can be set by the control voltage. In the present example, the inductance (H) increases when the control voltage is reduced, whereas when the control voltage is made high, the inductance (H) becomes small. If such a structure that the control voltage is applied to the gate electrode, is taken, it is also possible to set the inductance (H) low when the control voltage is reduced and set the inductance (H) high when the control voltage is increased. Simply adjusting the control voltage for the variable capacitance in this way makes it possible to set the inductance easily and stably.

Figure 10:
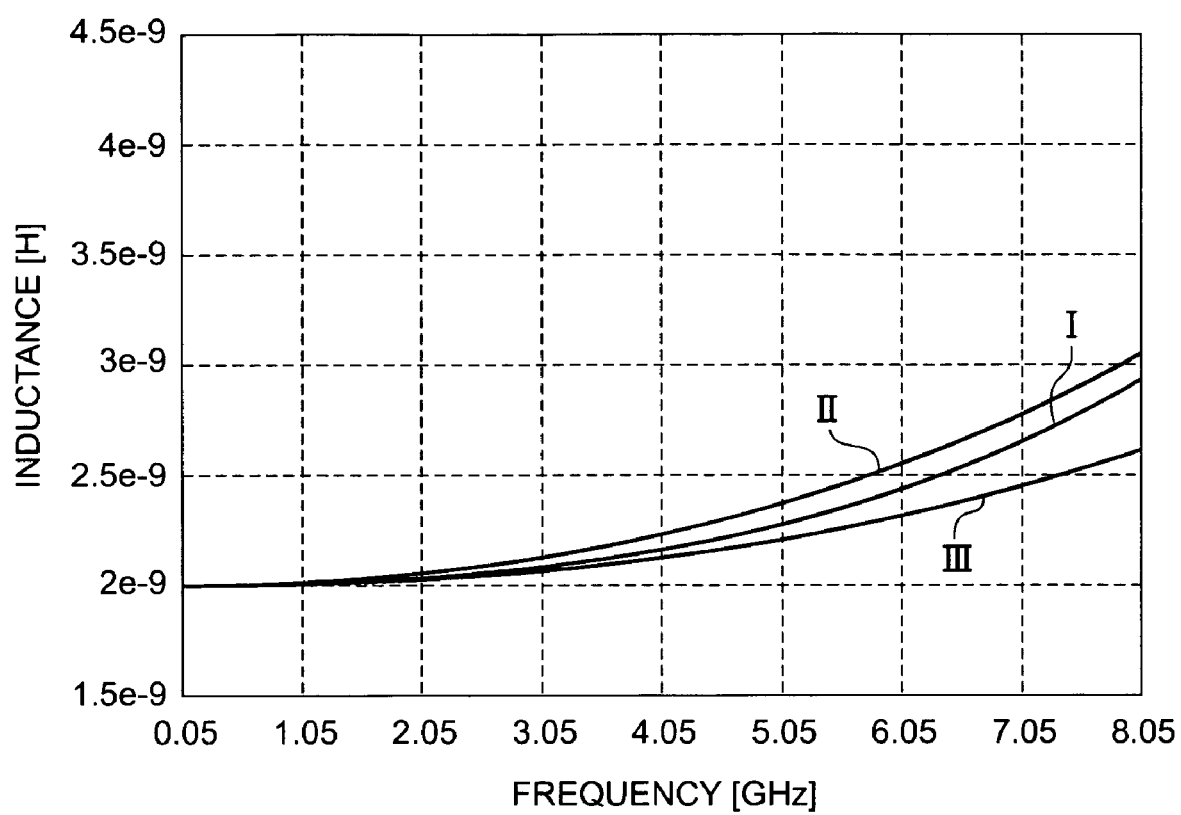
FIG. 10 is a view showing changes in the inductance of the variable spiral inductor according to the first embodiment with respect to the frequencies.

FIG. 10 shows changes in the inductance of the variable spiral inductor according to the first embodiment with respect to the frequencies. The horizontal axis indicates the frequency (GHz) of an input signal, and the vertical axis indicates the inductance (H) between the first input/output electrode 31 and the second input/output electrode 33. A curve I indicates inductance (H) of a conventional spiral inductor free of a variable capacitance diode. A curve II indicates where the control voltage of the variable spiral inductor according to the first embodiment is low (−1.8V in the present example). A curve III indicates where the control voltage of the variable spiral inductor according to the first embodiment is high (1.8V in the present example). As described with reference to FIG. 9, the inductance (H) becomes large if the control voltage is set small (see curve II), whereas the inductance (H) becomes small if the control voltage is set large (see curve III). Thus, even when the inductance varies according to the frequency of the input signal, the inductance can be adjusted by changing the control voltage applied to the variable capacitance diode.

Second Preferred Embodiment

Configuration of Semiconductor Element According to Second Embodiment

A variable spiral inductor used as the semiconductor element according to the second embodiment is different from the variable spiral inductor according to the first embodiment in that a capacitance variable section is equipped with a fixed capacitance in conjunction with a variable capacitance diode. The fixed capacitance may preferably be configured as an MIM (Metal-Insulator-Metal) capacitance wherein a first metal electrode electrically connected to a gate electrode, an insulator layer and a second metal electrode electrically connected to a variable capacitance control electrode are stacked over the gate electrode in order and configured. As the fixed capacitance, a PIP (Polysilicon-Insulator-Polysilicon) capacitance using first and second polycrystalline silicon electrodes as an alternative to the first and second metal electrodes may be adopted. A description will be made below of the case in which the MIM capacitance is used as the fixed capacitance.

Figure 11A:
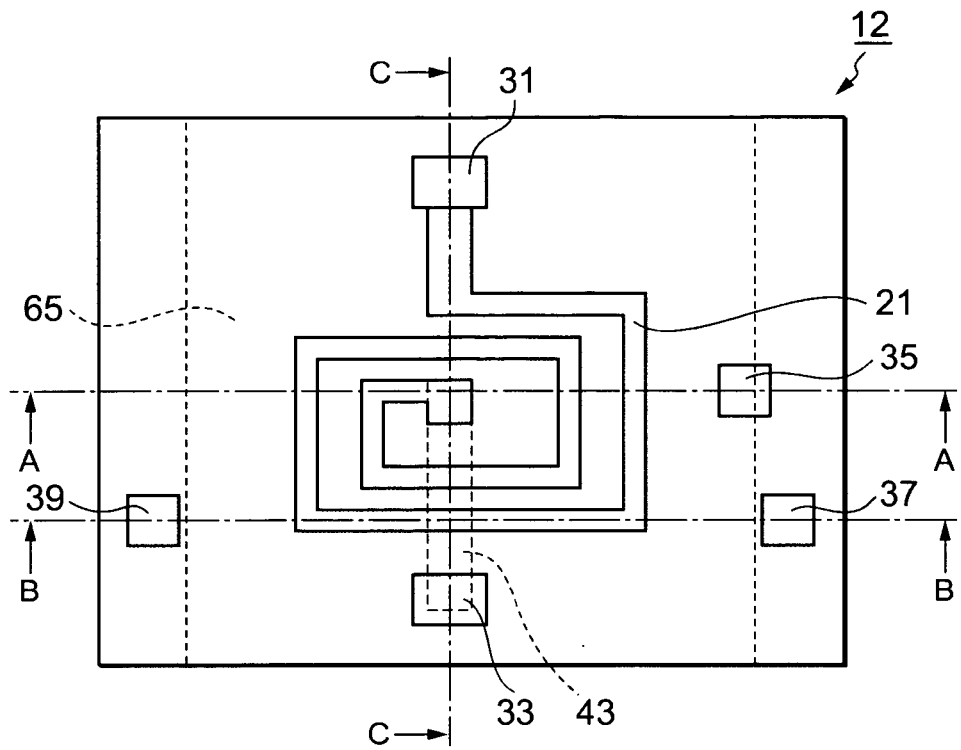
FIG. 11 is a view (part 1) for describing a configuration of a variable spiral inductor according to a second embodiment of the present invention.
Figure 11B:
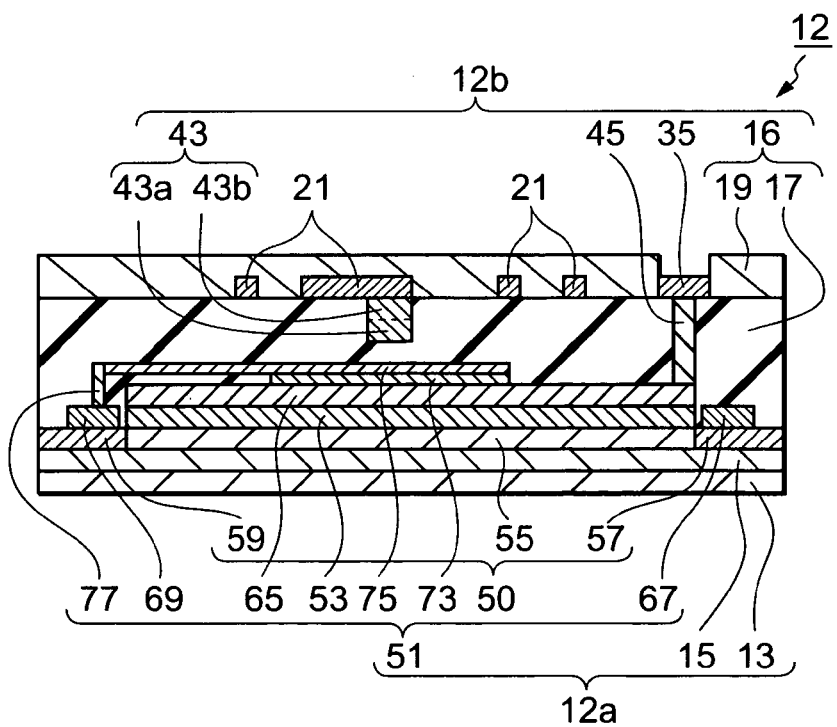
Figure 12A:
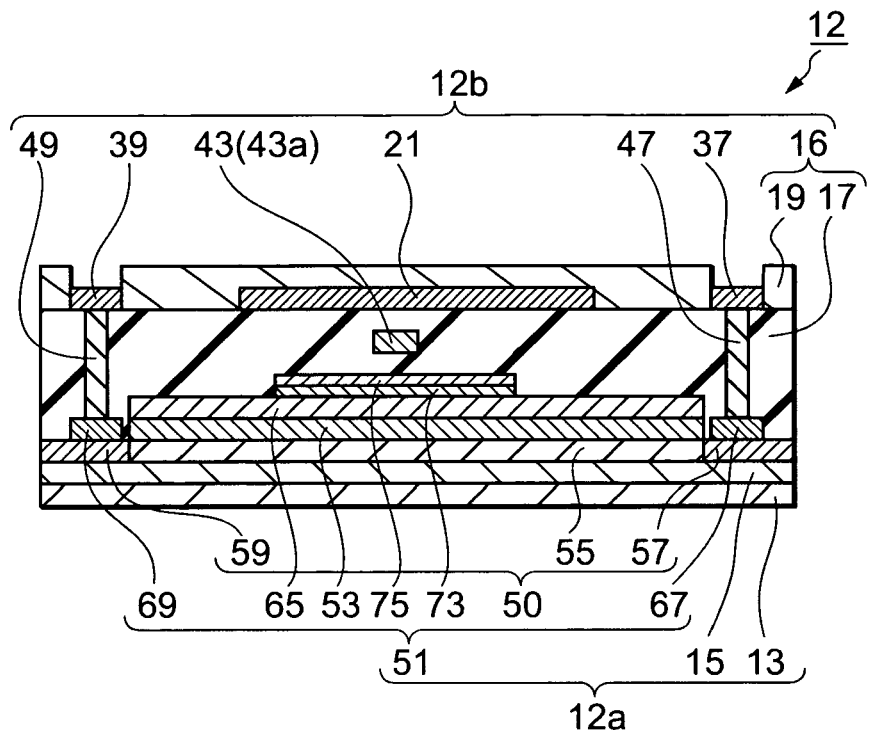
FIG. 12 is a view (part 2) for describing the configuration of the variable spiral inductor according to the second embodiment of the present invention.
Figure 12B:
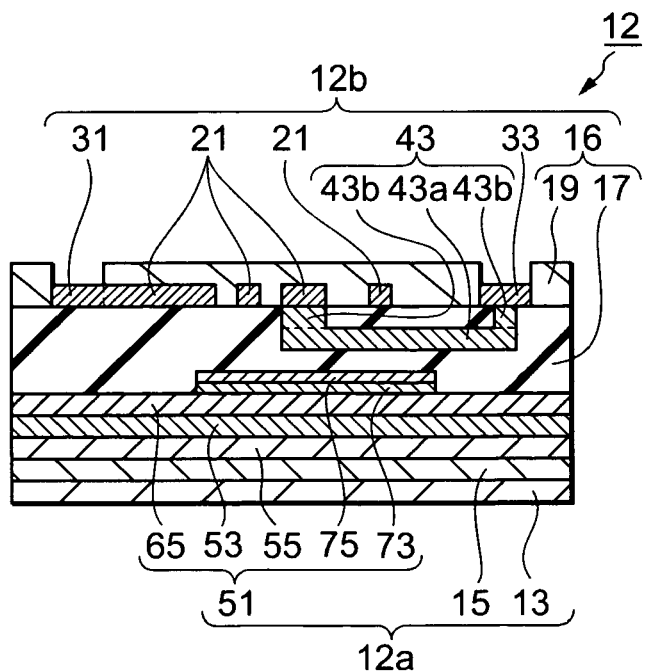

The configuration of the variable spiral inductor according to the second embodiment will be explained with reference to FIGS. 11 and 12. FIG. 11(A) is a schematic plan view showing the variable spiral inductor provided on an SOI substrate in a state in which a protective film located on its upper side has been omitted. FIG. 11(B) is a cross-sectional view taken along line A-A shown in FIG. 11(A). FIG. 12(A) is a cross-sectional view taken along line B-B shown in FIG. 11(A). FIG. 12(B) is a cross-sectional view taken along line C-C shown in FIG. 11(A).

The first metal electrode may be configured as a gate electrode 65 per se. Alternatively, the first metal electrode is disposed on the gate electrode 65 and may be electrically connected to the gate electrode 65. When the first metal electrode and the gate electrode are configured as discrete parts, the first metal electrode may be provided on the gate electrode 65 with an insulating layer interposed therebetween according to the design. Alternatively, the first metal electrode and the gate electrode 65 may be provided in the same process. The present embodiment will explain an example in which the first metal electrode is formed of the gate electrode 65 per se. An insulator layer 73 is provided on the gate electrode 65 corresponding to the first metal electrode. The insulator layer 73 can be formed in the same process as an interlayer insulating film 17 and formed of the same material. A second metal electrode 75 is provided on the insulator layer 73. The second metal electrode 75 is electrically connected to a first or second variable capacitance control electrode 67 or 69 via an MIM connecting electrode 77. Except for the provision of the MIM capacitance, an inductor section 12b is formed over a capacitance variable section 12a in a configuration similar to the first embodiment. Accordingly, the description of other parts will be omitted.

Figure 13A:
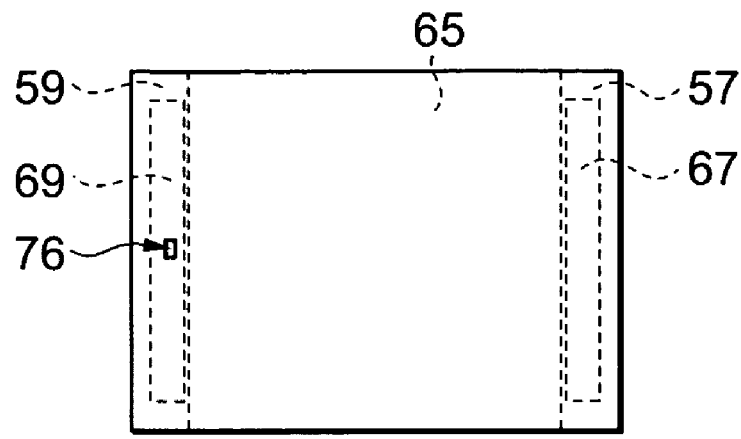
FIG. 13 is a process view (part 1) for describing a method of manufacturing the variable spiral inductor according to the second embodiment of the present invention.
Figure 13B:
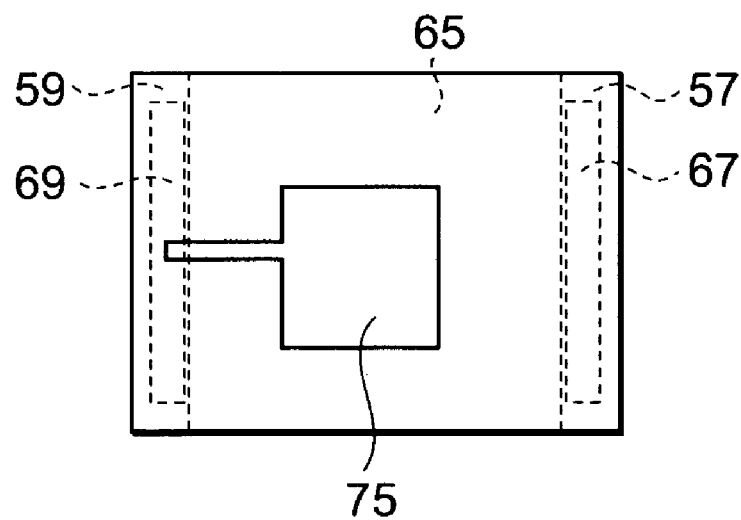
Figure 14A:
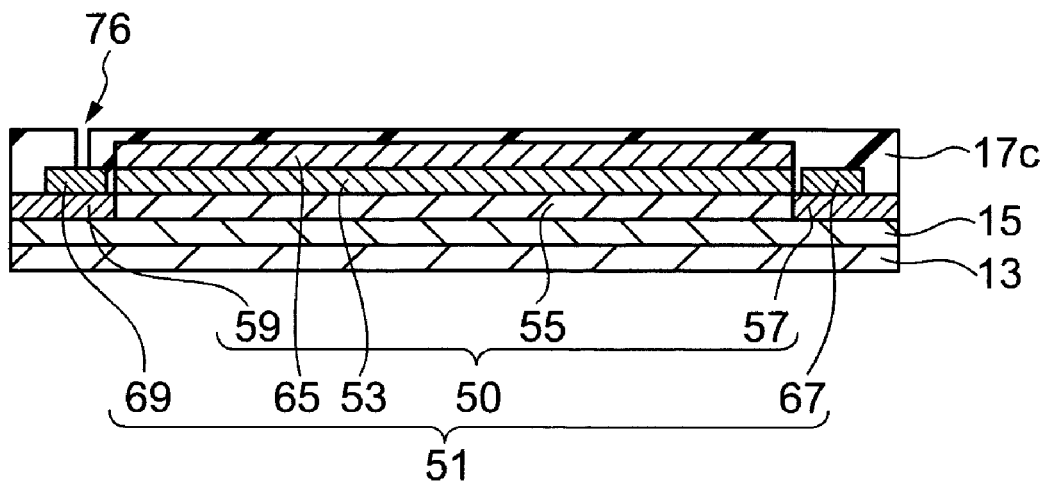
FIG. 14 is a process view (part 2) for describing the method of manufacturing the variable spiral inductor according to the second embodiment of the present invention.
Figure 14B:
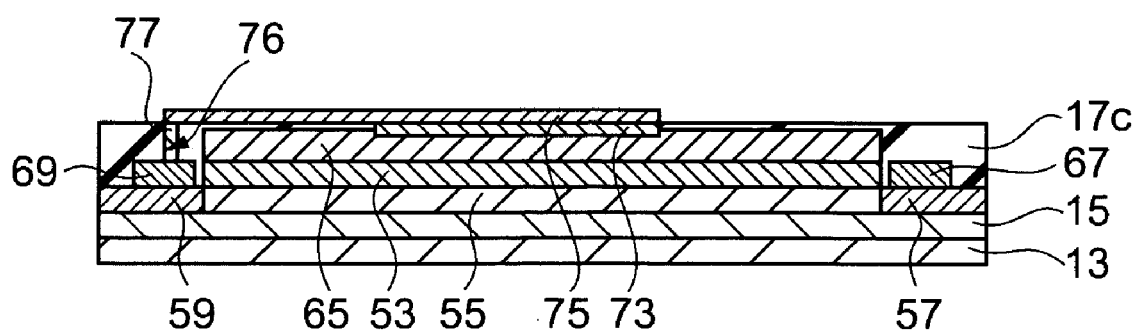

Method of Manufacturing Semiconductor Element According to Second Embodiment A method of manufacturing the variable spiral inductor according to the second embodiment will be described with reference to FIGS. 13(A) and 13(B) and FIGS. 14(A) and 14(B). FIGS. 13(A) and 13(B) are respectively process views corresponding to FIG. 11(A) as viewed from the upper side of the variable spiral inductor. FIGS. 14(A) and 14(B) are respectively process views of the variable spiral inductor as viewed in a section taken along line A-A shown in FIG. 11(A).

Since the process of forming a variable capacitance diode in the SOI substrate is similar to the manufacturing process of the first embodiment described with reference to FIGS. 3(A) through 3(D) and FIGS. 5(A) through 5(D), its description will be omitted here.

In the present configurational example, a first metal electrode for the MIM capacitance is provided as the gate electrode 65 after the formation of the variable capacitance diode 51. When the first metal electrode is formed on the gate electrode as a part different from the gate electrode, the first metal electrode may be formed in the same process as that for the formation of the gate electrode. Alternatively, the first metal layer may be provided after the formation of an insulating layer.

An MIM insulating layer 17c, which covers the silicon layer 50 formed with the variable capacitance diode 51 is provided. The MIM insulating layer 17c is formed as an oxide film by, for example, a CVD method. Subsequently, an opening 76 for exposing the surface on the first variable capacitance control electrode 67 is defined in the MIM insulating layer 17c by the known photolitho/etching (see FIG. 13(A) and FIG. 14(A)).

Next, an MIM connecting electrode 77 is provided in the opening 76 of the MIM insulating layer 17c. The MIM connecting electrode 77 is formed by burying the opening 76 of the MIM insulating layer 17c with a metal such as tungsten by the CVD method, for example. Further, a second metal electrode 75 is provided on the MIM insulating layer 17c so as to be electrically connected to the MIM connecting electrode 77 (see FIG. 13(B) and FIG. 14(B)). A region, which corresponds to a region for the MIM insulating layer 17c and is located below the second metal electrode 75, is called an insulator layer (designated at reference numeral 73 in FIG. 11). Incidentally, the second metal electrode 75 and the MIM connecting electrode 77 may be formed in the same process as the first variable capacitance lead-out electrode 47 and the second variable capacitance lead-out electrode 49.

Next, a first insulating layer 17a is provided on the MIM insulating layer 17c. The first insulating layer 17a is formed using, for example, the CVD method and an etching technique. The first insulating layer 17a may preferably be formed of an oxide film. Since the variable spiral inductor is formed in a process similar to the first embodiment described with reference to FIGS. 6(A) through 6(D) after the formation of the first insulting layer 17a, the description thereof will be omitted.

Operation of Semiconductor Element According to Second Embodiment

Figure 15:
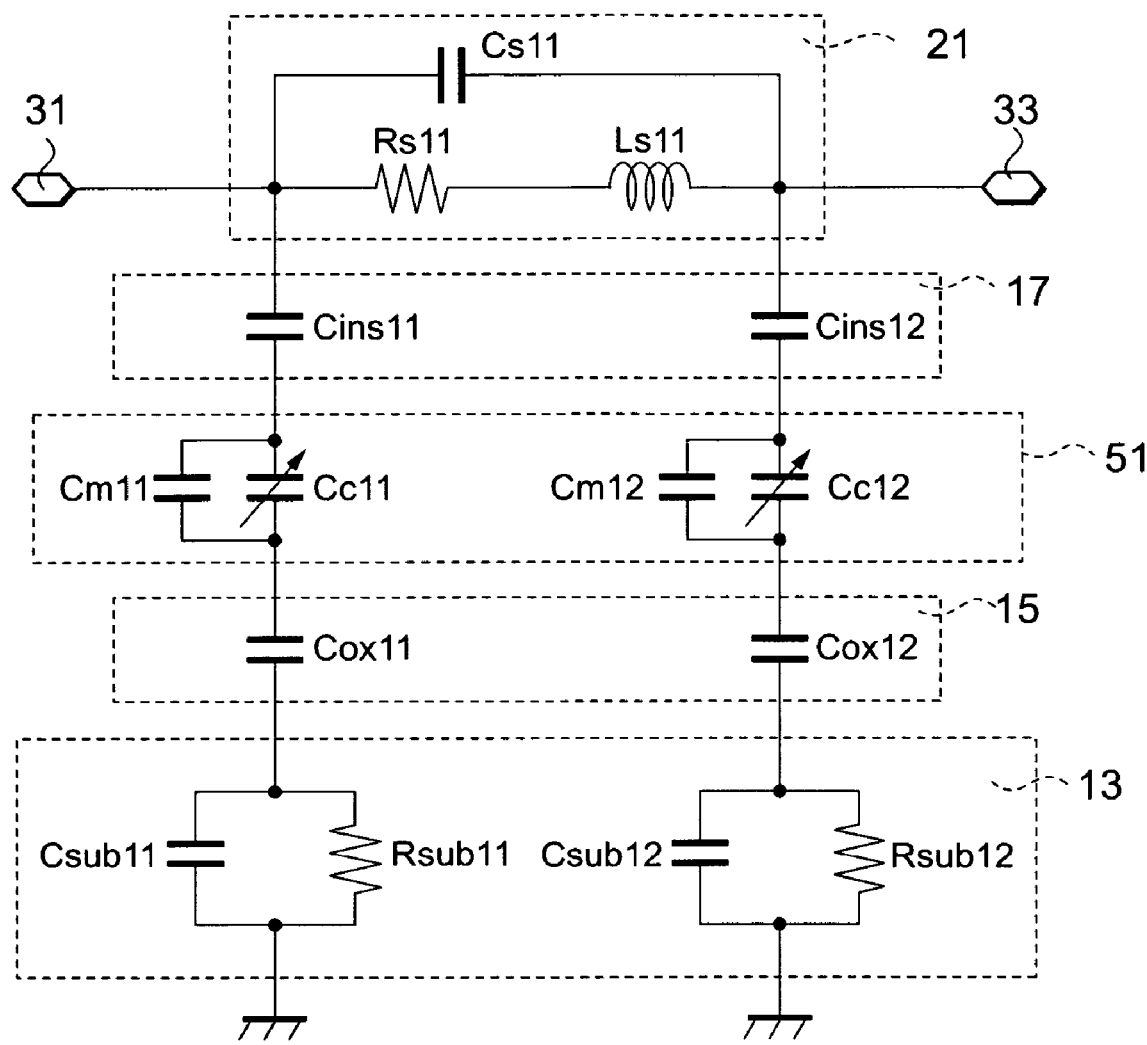
FIG. 15 is a view showing an equivalent circuit model of the variable spiral inductor according to the second embodiment of the present invention.

The operation of the second embodiment will be explained with reference to FIGS. 15 through 17. An equivalent circuit model of the variable spiral inductor according to the second embodiment shown in FIG. 15 is different from the equivalent circuit model of the variable spiral inductor according to the first embodiment described with reference to FIG. 7 in that MIM capacitances Cm11 and Cm12 are respectively provided in parallel with variable capacitance diodes Cc11 and Cc12.

Figure 16:
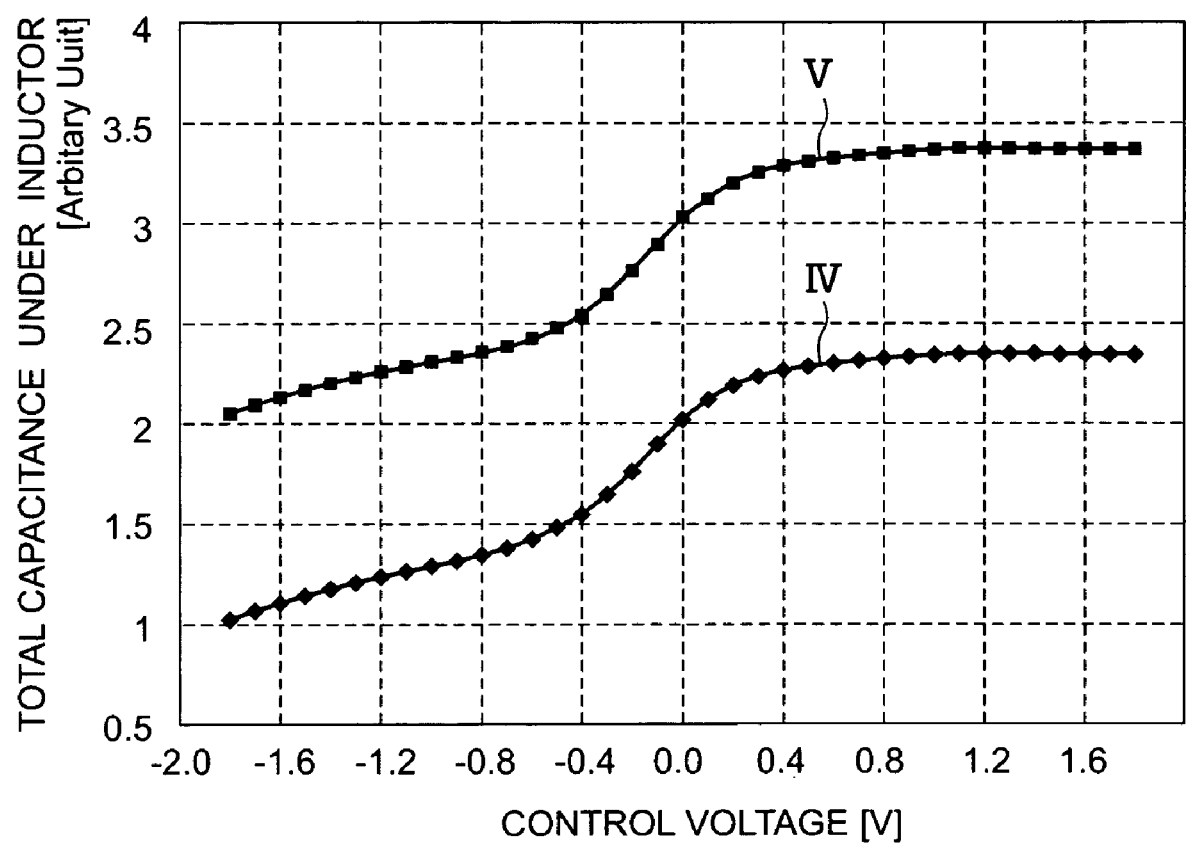
FIG. 16 is a view illustrating changes in the capacitances of the variable spiral inductors according to the first and second embodiments with respect to control voltages.

FIG. 16 is a view showing changes in the capacitance of the variable spiral inductor according to the configuration of the second embodiment with respect to control voltages in conjunction with the changes in the capacitance of the variable spiral inductor according to the configuration of the first embodiment with respect to the control voltages. The horizontal axis indicates a control voltage applied to each of the first and second variable capacitance control input/output electrodes 37 and 39, and the vertical axis indicates the whole or total capacitance (arbitrary unit) of the variable spiral inductor, which is obtained by combining the capacitances of the interlayer insulating film 17, the variable capacitance diode 51 and the support substrate 13. In the drawing, the capacitance of the variable capacitance diode according to the configuration of the first embodiment is represented by a curve IV, whereas the capacitance of the variable capacitance diode according to the configuration of the second embodiment is represented by a curve V. An adjustable range of the capacitance of the variable capacitance diode is shifted to the high side by the MIM capacitance corresponding to the fixed capacitance. Thus, with the provision of the MIM capacitance, the capacitance beyond the range (greater than or equal to 2.5 in an arbitrary unit in FIG. 16) adjustable with the variable spiral inductor according to the first embodiment can be adjusted.

Figure 17:
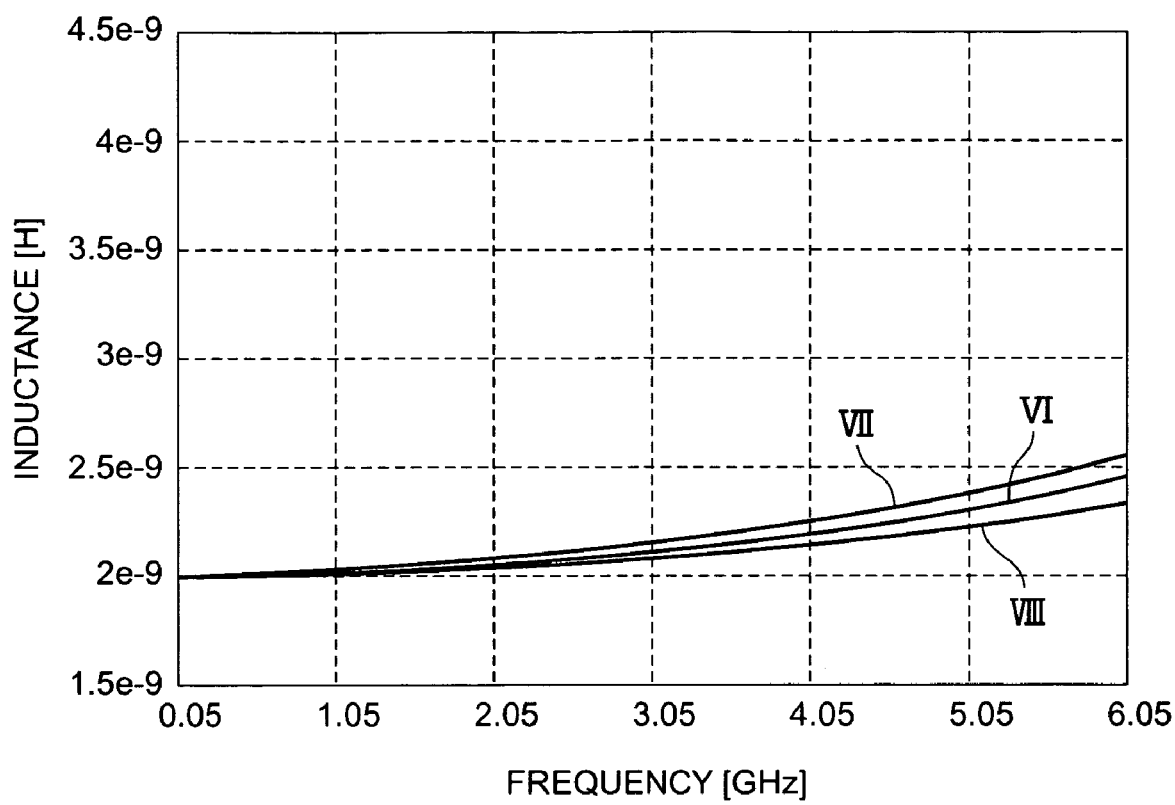
FIG. 17 is a view showing changes in the inductance of the variable spiral inductor according to the second embodiment with respect to the frequencies.

FIG. 17 shows changes in the inductance of the variable spiral inductor 12 according to the second embodiment with respect to the frequencies. The horizontal axis indicates the frequency (GHz) of an input signal, and the vertical axis indicates the inductance (H) between the first input/output electrode 31 and the second input/output electrode 33. A curve VI indicates inductance (H) of a conventional spiral inductor free of a variable capacitance diode. A curve VII indicates where the control voltage of the variable spiral inductor according to the second embodiment is low. A curve VIII indicates where the control voltage of the variable spiral inductor according to the second embodiment is high. Although the inductance varies according to the frequency of the input signal in the variable spiral inductor, the inductance can be adjusted by changing the control voltage.

Third Preferred Embodiment

Figure 18:
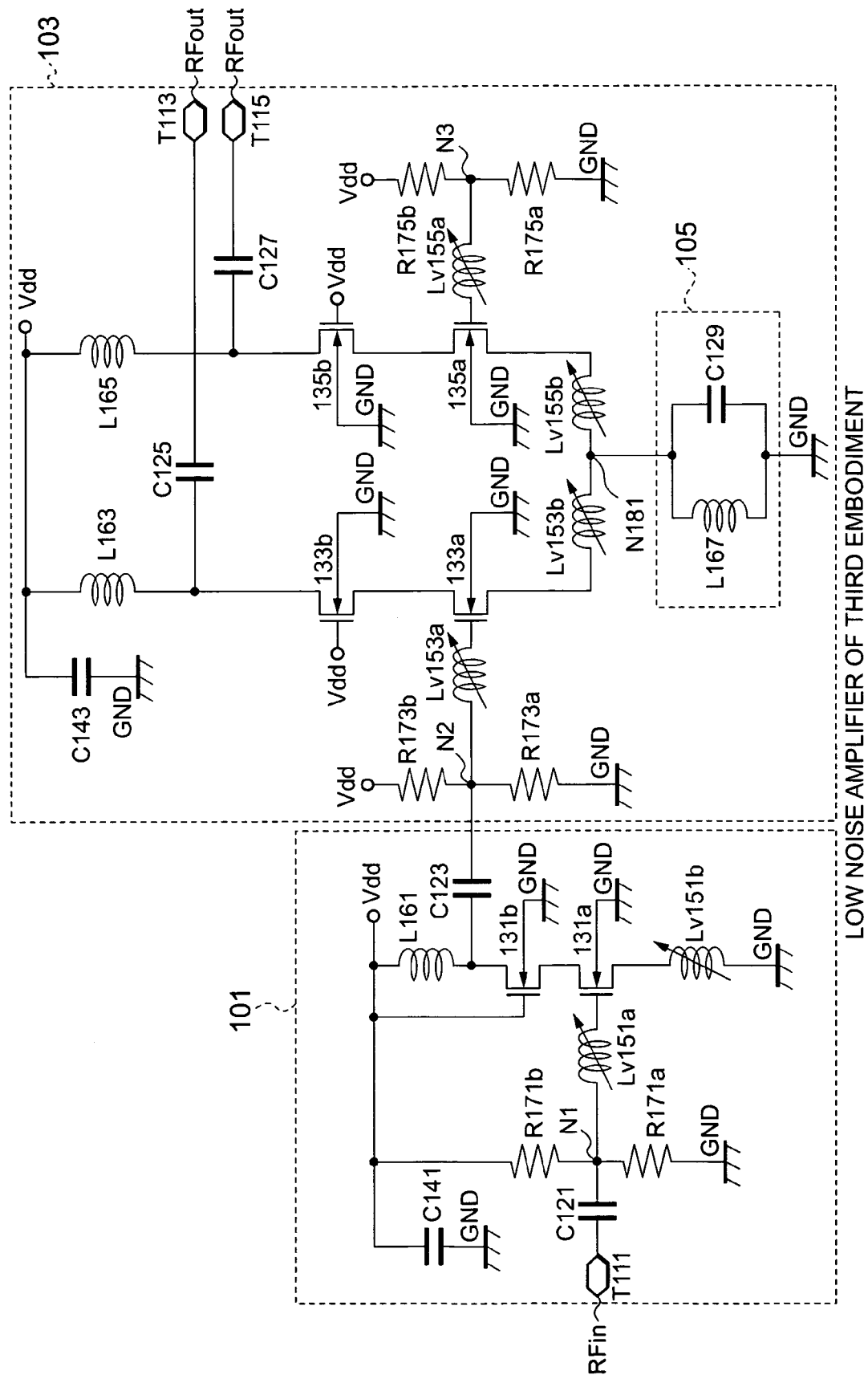
FIG. 18 is a view for describing a low noise amplifier according to a third embodiment of the present invention.

An embodiment showing a high frequency integrated circuit configured using the above-described semiconductor element of the present invention will be explained with reference to FIG. 18. The third embodiment will explain an example of a low noise amplifier (LNA) used in a receiving circuit section of the high frequency integrated circuit in particular. FIG. 18 is a schematic view for describing a circuit configuration of the LNA. The LNA described in the present embodiment is configured in two stages of a first-stage cascode amplifying section 101 and a differential cascode amplifying section 103.

A description will first be made of the first-stage cascode amplifying section 101. The first-stage cascode amplifying section 101 includes a cascode connection of two N type MOSFETs (hereinafter called NMOSs). The cascode connection of the NMOSs is configured by connecting a drain electrode of a first NMOS 131a and a source electrode of a second NMOS 131b. An input signal RFin corresponding to a high frequency signal is inputted to an input terminal T111.

The input terminal T111 is connected to the gate of the first NMOS 131a via an input capacitor C121 for removing a dc component of the input signal RFin and a first variable spiral inductor Lv151a. A power supply voltage Vdd is applied to a power supply terminal. The power supply terminal (designated at Vdd and similar below) is connected to a ground terminal GND via series-connected two first resistors R171a and R171b corresponding to a first resistive component. A connecting point N1 of the first resistors R171a and R171b is connected to the gate of the first NMOS 131a through the first variable spiral inductor Lv151a.

The voltage applied to the gate electrode of the first NMOS 131a is determined by resistive division of the first resistors R171a and R171b. A source electrode of the first NMOS 131a is connected to the ground terminal GND via a second variable spiral inductor Lv151b. The power supply terminal Vdd is connected to a gate electrode of the second NMOS 131b, and a drain electrode thereof is connected to the power supply terminal Vdd via an inductor L161. The inductor L161 is provided to prevent an AC signal from entering out of a power supply. A signal amplified by the first-stage cascode amplifying section 101 is sent from the drain electrode of the second NMOS 131b to the differential cascode amplifying section 103 through a first output capacitor C123 for removing a dc component contained in the signal.

Next, the differential cascode amplifying section 103 will be explained. The differential cascode amplifying section 103 includes a cascode connection of a third NMOS 133a and a fourth NMOS 133b, and a cascode connection of a fifth NMOS 135a and a sixth NMOS 135b. These cascode connections are configured by connecting a drain electrode of the third NMOS 133a and a source electrode of a fourth NMOS 133b and connecting a drain electrode of the fifth NMOS 135a and a source electrode of a sixth NMOS 135b.

The first output capacitor C123 of the first-stage cascode amplifying section 101 is connected to its corresponding gate electrode of the third NMOS 133a via a third variable spiral inductor Lv153a. A power supply terminal Vdd is connected to its corresponding ground terminal via series-connected two second resistors R173a and R173b corresponding to a second resistive component. A second connecting point N2 of the second resistors R173a and R173b is connected to its corresponding gate electrode of the third NMOS 133a via the third variable spiral inductor Lv153a. The voltage applied to the gate electrode of the third NMOS 133a is determined by resistive division of the second resistors R173a and R173b. A source electrode of the third NMOS 133a is connected to a node (connecting point) N181 via a fourth variable spiral inductor Lv153b. The power supply terminal is connected to a gate electrode of the fourth NMOS 133b, and a drain electrode thereof is connected to the power supply terminal via an inductor L163. The inductor L163 is provided to prevent an AC signal from entering out of a power supply. A signal amplified by the cascode-connected third NMOS 133a and fourth NMOS 133b is sent from the drain electrode of the fourth NMOS 133b to a first output terminal T113 through a second output capacitor C125 for removing a dc component contained in the signal.

Further, the power supply voltage Vdd is connected to its corresponding ground terminal GND via series-connected two third resistors R175a and R175b corresponding to a third resistive component. A third connecting point N3 of the third resistors R175a and R175b is connected to its corresponding gate of the fifth NMOS 135a via a fifth variable spiral inductor Lv155a. The voltage applied to the gate electrode of the fifth NMOS 135a is determined by resistive division of the third resistors R175a and R175b. A source electrode of the fifth NMOS 135a is connected to the node N181 via a sixth variable spiral inductor Lv155b. The power supply terminal Vdd is connected to its corresponding gate electrode of the sixth NMOS 135b, and a drain electrode thereof is connected to the power supply terminal Vdd via an inductor L165. The inductor L165 is provided to prevent an AC signal from entering out of a power supply. A signal amplified by the cascode-connected fifth NMOS 135a and sixth NMOS 135b is sent from the drain electrode of the sixth NMOS 135b to a second output terminal T115 through a third output capacitor C127 for removing a dc component contained in the signal. The amplified high frequency signal RFout is outputted from the first and second output terminals T113 and T115.

The node N181 is connected to its corresponding ground terminal GND via an LC oscillation circuit 105 in which an inductor L167 and a capacitor C129 are connected in parallel. The LC oscillation circuit 105 is provided to bring the node N181 to a ground state in accordance with the frequency of a signal.

Decoupling capacitors C141 and C143 are respectively inserted between the power supply terminals Vdd and the ground terminals GND of the first-stage cascode amplifying section 101 and the differential cascode amplifying section 103. The decoupling capacitors C141 and C143 are provided to enhance the stability of the power supply.

The first through sixth variable spiral inductors Lv151a through Lv155b are 50Ω impedance matching inductors. An amplifying effect in a desired frequency band can be enhanced by 50Ω impedance matching in the desired frequency band. Using the variable spiral inductor described in each of the first and second embodiments in the 50Ω impedance matching inductor enables easy 50Ω impedance matching.

Fourth Preferred Embodiment

Figure 19:
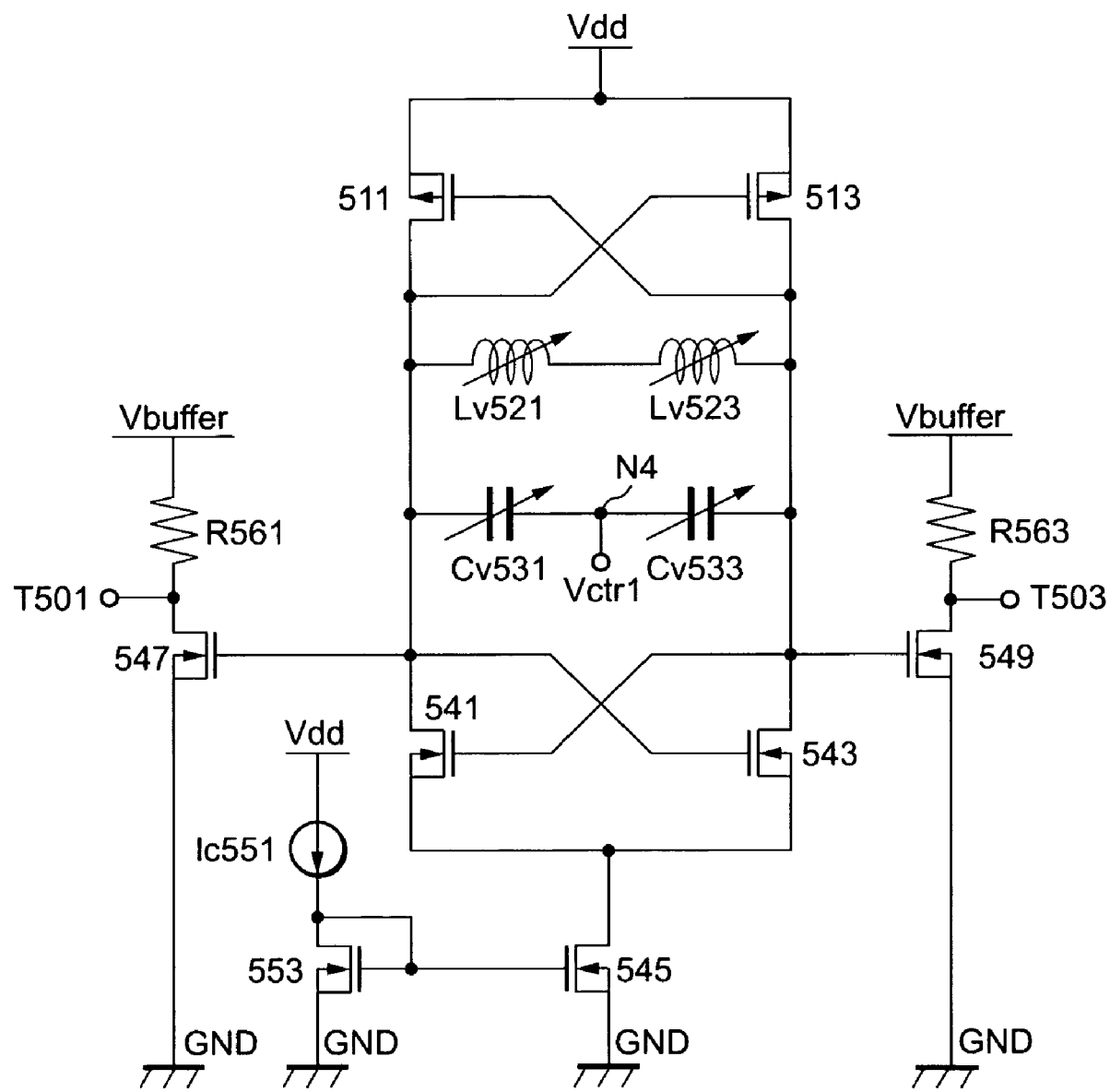
FIG. 19 is a schematic view for describing an LC-VCO circuit configuration.

The above-mentioned third embodiment has explained the receiving circuit section of the high frequency circuit. A fourth embodiment will explain an example of a voltage controlled oscillator (VCO) used in a transmitting circuit section of a high frequency circuit in particular with reference to FIG. 19.

Source electrodes of a first PMOS 511 and a second PMOS 513 are connected to each other and held at a potential of Vdd. A drain electrode of the first PMOS 511 is connected to a gate electrode of the second PMOS 513. A drain electrode of the second PMOS 513 is connected to a gate electrode of the first PMOS 511.

Inductors and capacitors are respectively connected in parallel between the drain electrode of the first PMOS 511 and the drain electrode of the second PMOS 513. Here, first and second variable spiral inductors Lv521 and Lv523 described in the first and second embodiments are connected in series and constitute the inductors. As to the capacitors, first and second variable capacitors Cv531 and Cv533 are connected in series, and a control voltage Vctrl is applied to a connecting point N4 between the first and second variable capacitors Cv531 and Cv533. Variable capacitance diodes are used as the first and second variable capacitors Cv531 and Cv533.

The drain electrode of the first PMOS 511 is connected to a drain electrode of a first NMOS 541 and a gate electrode of a second NMOS 543. The drain electrode of the second PMOS 513 is connected to a gate electrode of the first NMOS 541 and a drain electrode of the second NMOS 543.

Source electrodes of the first NMOS 541 and the second NMOS 543 are connected to a drain electrode of a third NMOS 545. A source electrode of the third NMOS 545 is connected to a ground terminal. A constant current circuit comprising a constant current source Ic551 and an NMOS 553 is connected to a gate electrode of the third NMOS 545. The drain electrodes of the first PMOS 511 and the second PMOS 513 are respectively connected to gate electrodes of a fourth NMOS 547 and a fifth NMOS 549. Drain electrodes of the fourth NMOS 547 and the fifth NMOS 549 are respectively connected to a first output terminal T501 and a second output terminal T503. The first output terminal T501 is connected to its corresponding output adjustment or control voltage terminal via a resistor R561. The second output terminal T503 is connected to its corresponding output control voltage terminal via a resistor R565. The output control voltage terminal is held at a potential corresponding to an output control voltage Vbuffer. Source electrodes of the fourth NMOS 547 and the fifth NMOS 549 are both connected to the ground terminal.

Since the inductors and the capacitors are respectively connected in parallel, a signal oscillation occurs in such a circuit configuration and the frequency f of an oscillation signal at this time is expressed in $f=\frac{1}{2}\times(LC)^{-1/2}$.

While the frequency of an oscillation circuit is normally being changed by adjusting a variable capacitor by a control voltage, the VCO of the present invention is capable of further changing the inductance of a variable spiral inductor to thereby perform an adjustment for extending a variable range of the oscillation frequency.

Figure 20:
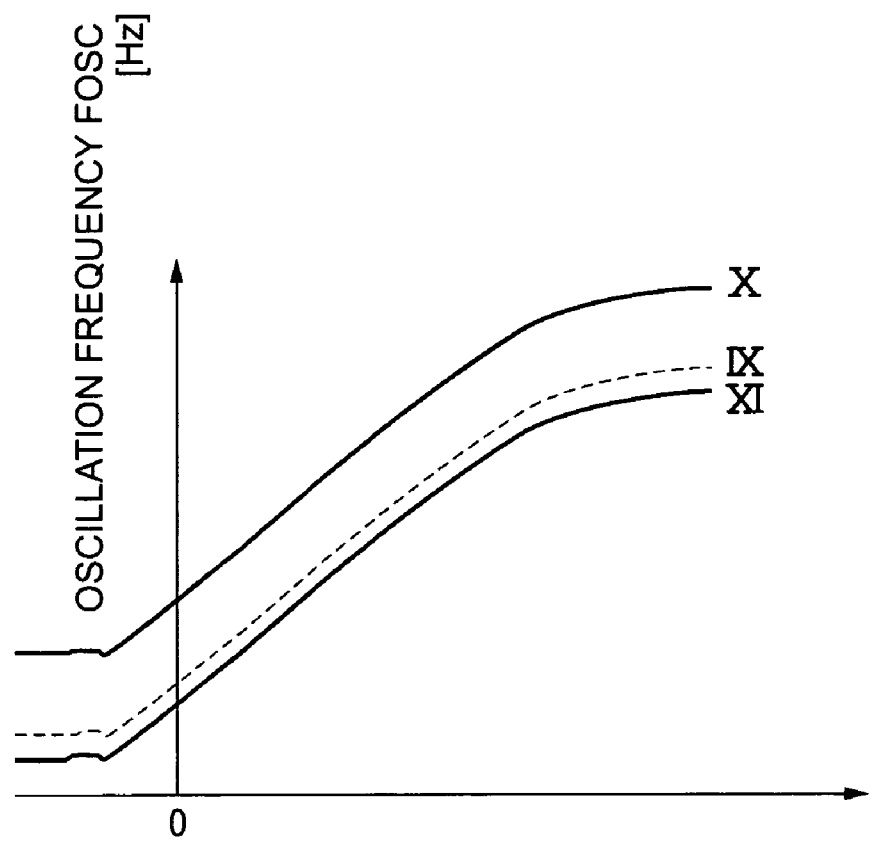
FIG. 20 is a view for describing oscillation frequency characteristics of an LC-VCO circuit.
Figure 21A:
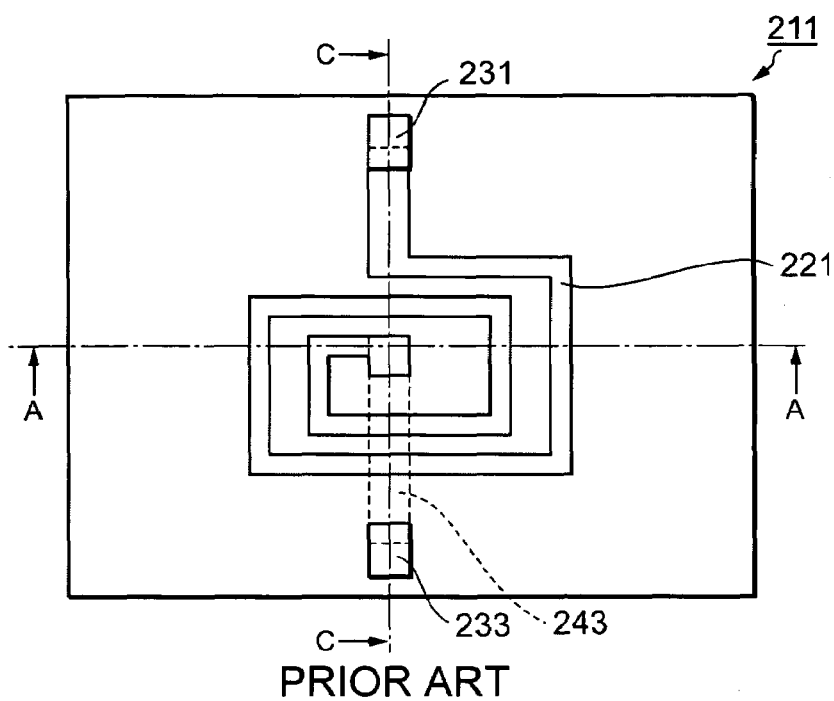
FIG. 21 is a view for describing a prior art example of a spiral inductor provided on an SOI substrate.
Figure 21B:
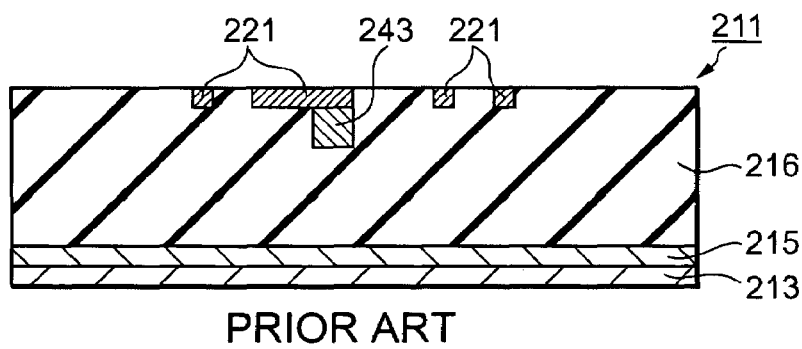
Figure 21C:
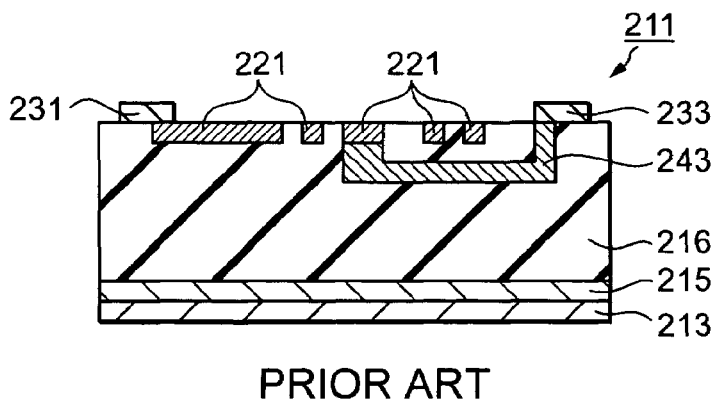
Figure 22:
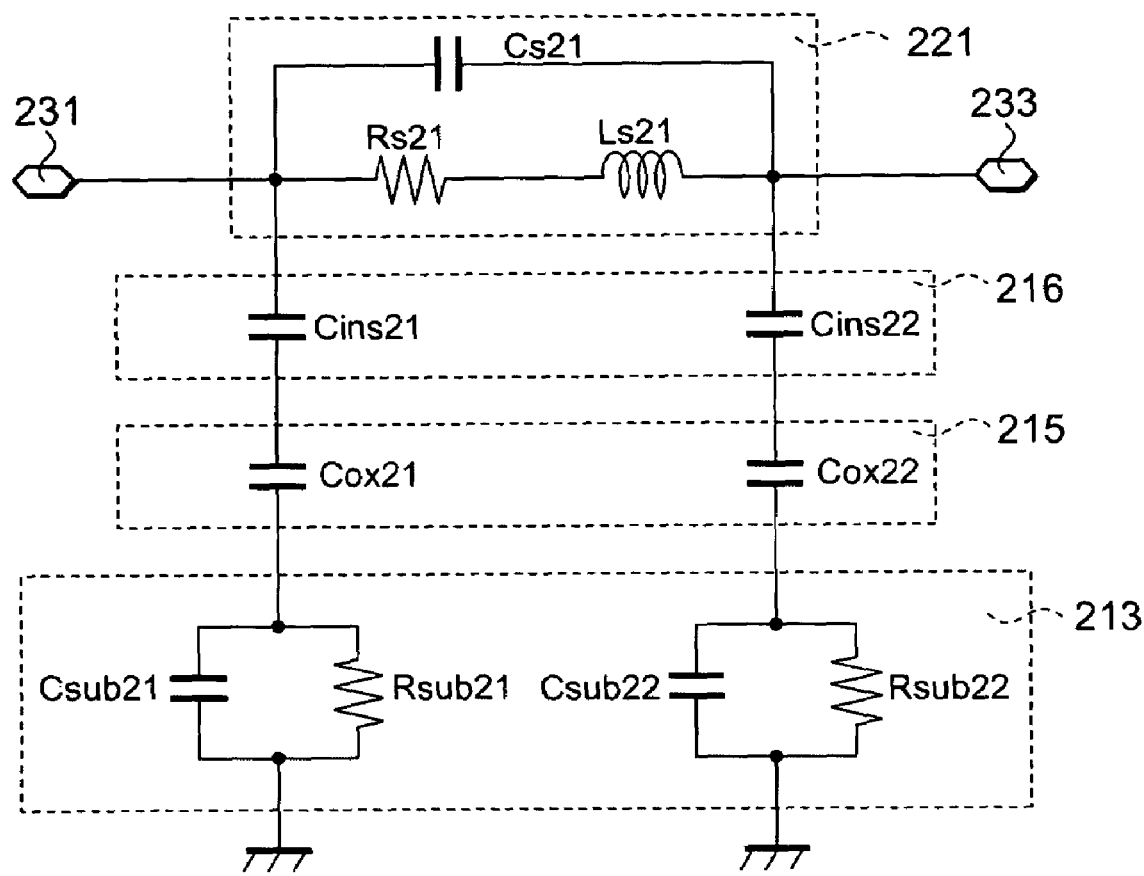
FIG. 22 is a view showing an equivalent circuit model of a prior art example of a spiral inductor.
Figure 23:
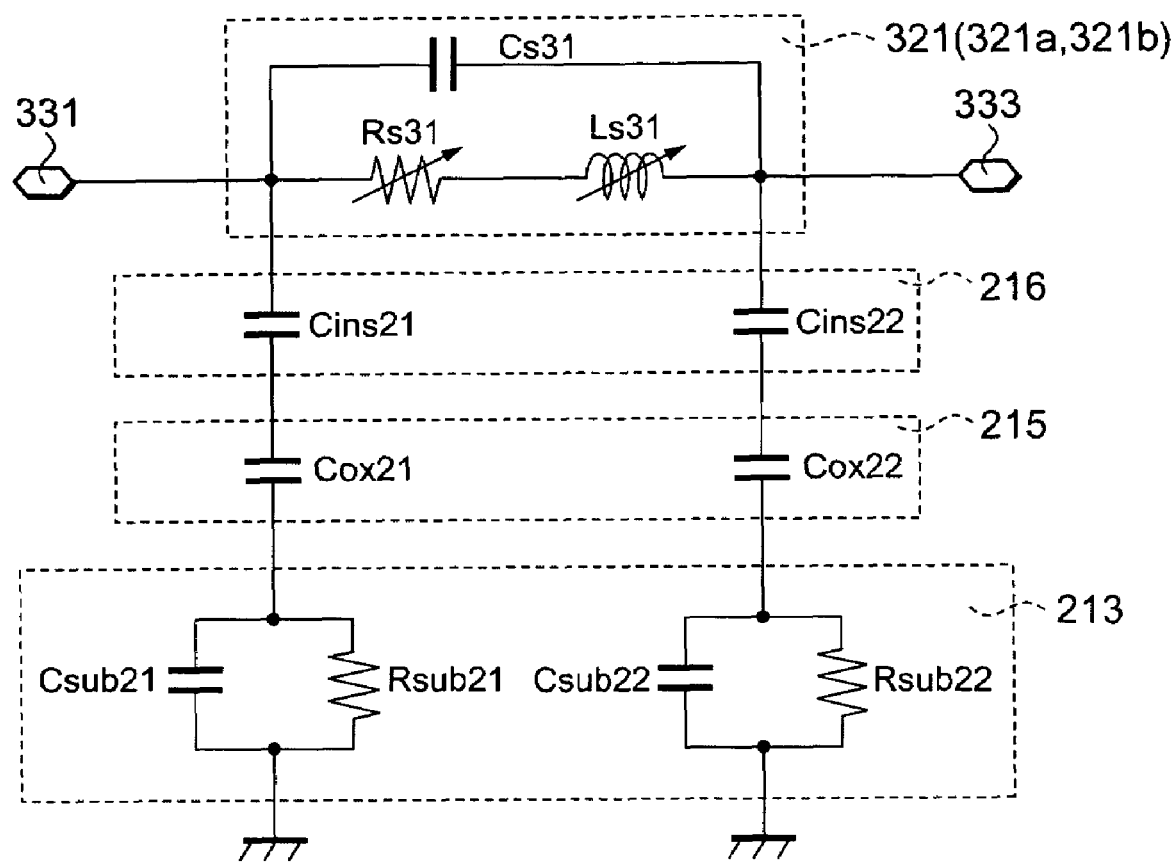
FIG. 23 is a view illustrating an equivalent circuit model of a prior art example of a variable spiral inductor.
Figure 24:
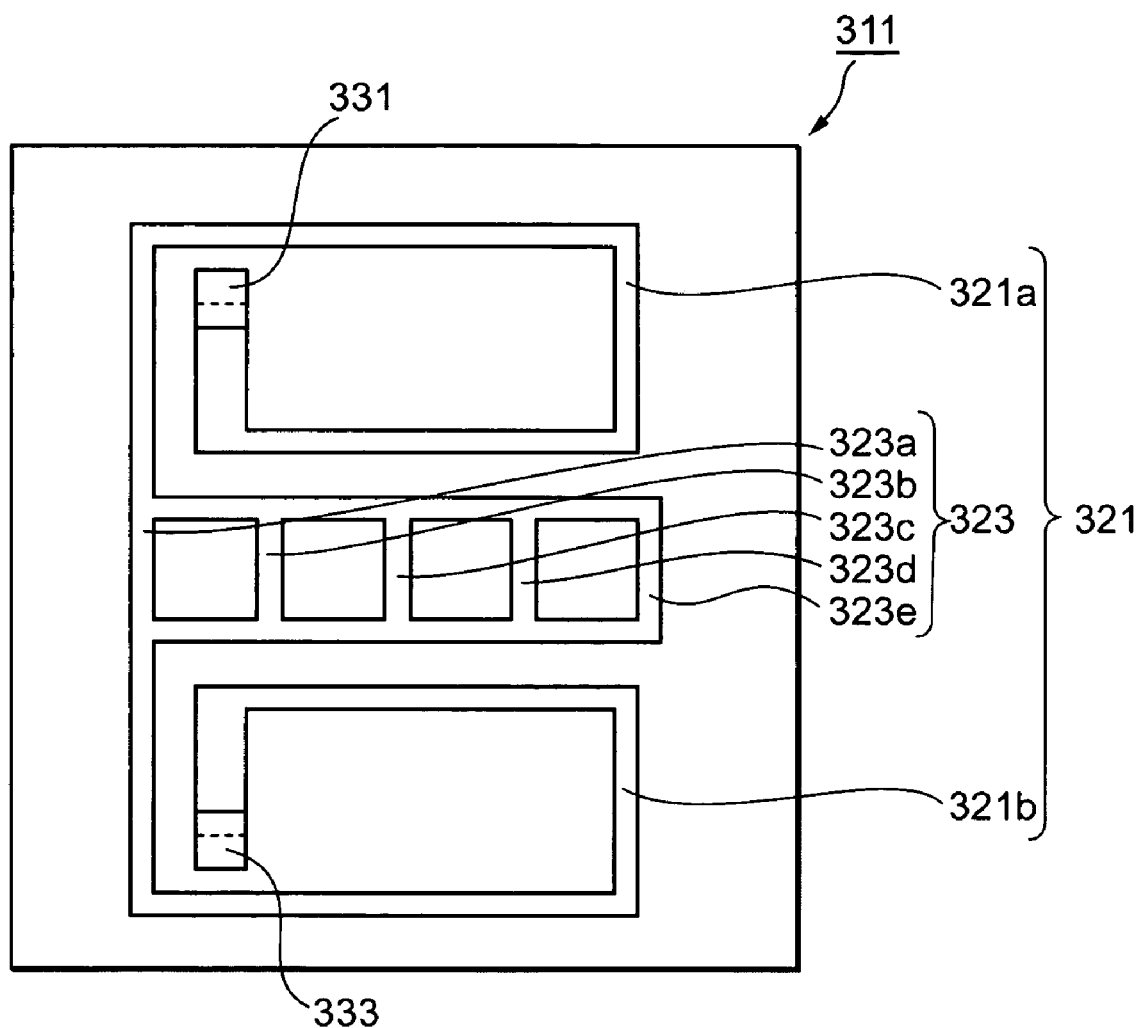
FIG. 24 is a schematic plan view of the prior art example of the variable spiral inductor as viewed thereabove.

FIG. 20 is a view for describing oscillation frequency characteristics of the VCO of the fourth embodiment. The horizontal axis indicates the control voltage [V] of the variable capacitor, and the vertical axis indicates the oscillation frequency f [Hz]. In FIG. 20, a curve IX indicates an oscillation frequency in a circuit placed in a state in which the control voltage of the variable capacitor has been changed without changing the inductance. If the variable spiral inductor described in each of the first and second embodiments is used as the inductor, then an oscillation frequency corresponding to each setting can be obtained in a range from a curve X to a curve XI.

According to the semiconductor element of the present invention, an inductor section is provided on a capacitance variable section configured with a variable capacitance diode provided therein. The variable capacitance diode changes according to a control voltage. Since the inductance of the semiconductor element changes in accordance with a change in the capacitance of the variable capacitance diode, the inductance can be easily set.

By adopting a PN junction diode or a MOS diode as the variable capacitance diode, a semiconductor element having a variable inductance can be fabricated without the need for a specific process by the known method.

The capacitance variable section includes an MIM capacitance configured by sequentially stacking, over a first control electrode, a first metal electrode electrically connected to the first control electrode, an insulator layer and a second metal electrode electrically connected to a second control electrode, or a PIP capacitance configured by sequentially stacking, over a first control electrode, a first polycrystalline silicon electrode electrically connected to the first control electrode, an insulator layer, and a second polycrystalline silicon electrode electrically connected to a second control electrode. Thus, the capacitance can be set to beyond a settable range of the variable capacitance diode.

The present invention is capable of providing a method of manufacturing a semiconductor element having a variable inductance without the need for a specific process by a known method.

Upon implementation of the above semiconductor element manufacturing method, following the step for forming the variable capacitance diode, a fixed capacitance may preferably be provided which electrically connects the first control electrode and the second control electrode and is located on the first control electrode.

According to the above semiconductor element manufacturing method, the MIM capacitance or the PIP capacitance can be provided without the need for the specific process. Therefore, a semiconductor element can be fabricated which is capable of easily setting the capacitance to beyond the settable range of the variable capacitance diode.

According to a high frequency integrated circuit of the present invention, since a variable spiral inductance is used in a first-stage amplifying section for making impedance matching of input and output signals, the impedance matching of the input and output signals is easily made.

According to the high frequency integrated circuit of the present invention, since the variable spiral inductance is used in conjunction with a variable capacitance, it is possible to make an adjustment for expanding a variable range of an oscillation frequency.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor element comprising:
a capacitance variable section provided, on an insulative substrate, with a variable capacitance diode equipped with first and second control electrodes;
an insulating layer provided over the capacitance variable section; and
an inductor section which includes first and second input/output electrodes and first and second control input/output electrodes distinct from said first and second input/output electrodes provided on an upper side of the insulating layer so as to be exposed respectively, and which includes a turbinated spiral electrode for electrically connecting the first input/output electrode and the second input/output electrode, a first control lead-out electrode for electrically connecting between the first control electrode and the first control input/output electrode, and a second control lead-out electrode for electrically connecting between the second control electrode and the second control input/output electrode, all of which are respectively provided within the insulating layer.

2. The semiconductor element according to claim 1, wherein the variable capacitance diode is a PN junction diode.

3. The semiconductor element according to claim 1, wherein the variable capacitance diode is a MOS diode.

4. The semiconductor element according to claim 1, wherein the capacitance variable section includes a fixed capacitance configured by sequentially laminating, over the first control electrode, a first metal electrode electrically connected to the first control electrode, an insulator layer and a second metal electrode electrically connected to the second control electrode.

5. The semiconductor element according to claim 1, wherein the capacitance variable section includes a fixed capacitance configured by sequentially stacking, over the first control electrode, a first polycrystalline silicon electrode electrically connected to the first control electrode, an insulator layer, and a second polycrystalline silicon electrode electrically connected to the second control electrode.

6. A high frequency integrated circuit comprising:
a first-stage cascode amplifying section configured so as to include first and second N type MOSFETs, a first inductor, an input capacitor, a first output capacitor, first and second variable inductors and a first resistive component; and
a differential cascode amplifying section configured so as to include third, fourth, fifth and sixth N type MOSFETs, second third and fourth inductors, second and third output capacitors, third, fourth, fifth and sixth variable inductors, and second and third resistive components,
wherein in the first-stage cascode amplifying section, a drain electrode of the first N type MOSFET is connected to a source electrode of the second N type MOSFET,
a drain electrode of the second N type MOSFET is connected to a power supply terminal through the first inductor and further connected to the first output capacitor,
a gate electrode of the second N type MOSFET is connected to the power supply terminal,
a source electrode of the first N type MOSFET is connected to a ground terminal through the second variable inductor,
the first resistive component comprises first and second resistive elements connected in series at a first connecting point between the power supply terminal and the ground terminal,
a gate electrode of the first N type MOSFET is connected to the first connecting point between the first and second resistive elements through the first variable inductor, and
an input terminal is connected to the first connecting point through the input capacitor, and
wherein in the differential cascode amplifying section, a drain electrode of the third N type MOSFET is connected to a source electrode of the fourth N type MOSFET,
a drain electrode of the fourth N type MOSFET is connected to the power supply terminal through the second inductor and further connected to a first output terminal through the second output capacitor,
a gate electrode of the fourth N type MOSFET is connected to the power supply terminal,
a source electrode of the third N type MOSFET is connected to a source electrode of the fifty N type MOSFET through the fourth and sixth variable inductors connected in series,
the second resistive component comprises third and fourth resistive elements connected in series between the power supply terminal and the ground terminal,
a gate electrode of the third N type MOSFET is connected to a second connecting point between the third and fourth resistive elements through the third variable inductor, a drain electrode of the fifth N type MOSFET is connected to a source electrode of the sixth N type MOSFET,
a drain electrode of the sixth N type MOSFET is connected to the power supply terminal through the third inductor and further connected to a second output terminal through the third output capacitor,
a gate electrode of the sixth N type MOSFET is connected to the power supply terminal,
the third resistive component comprises fifth and sixth resistive elements connected in series between the power supply terminal and the ground terminal,
a gate electrode of the fifth N type MOSFET is connected to a third connecting point between the fifth and sixth resistive elements through the fifth variable inductor,
a fourth connecting point between the fourth and sixth variable inductors is connected to the ground terminal through a parallel circuit of the fourth inductor and a capacitor, and
the second connecting point is connected to the first output capacitor, and
the first, second, third, fourth, fifth and sixth variable inductors are respectively a semiconductor element described in claim 1.

7. A high frequency integrated circuit comprising:
first and second P type MOSFETs;
first, second, third, fourth and fifth N type MOSFETs;
an inductor;
a capacitor; and
first and second control resistors,
wherein source electrodes of the first P type MOSFET and the second P type MOSFET are connected to a power supply terminal,
a drain electrode of the first P type MOSFET is connected to a gate electrode of the second P type MOSFET,
a drain electrode of the second P type MOSFET is connected to a gate electrode of the first P type MOSFET,
the inductor and the capacitor are connected in parallel between the drain electrode of the first P type MOSFET and the drain electrode of the second P type MOSFET,
the inductor comprises a fist variable inductor and a second variable inductor connected in series,
the capacitor comprises a first variable capacitor and a second variable capacitor connected in series and includes a control voltage terminal connected to a connecting point of the first and second variable capacitors,
the drain electrode of the first P type MOSFET is connected to a drain electrode of the first N type MOSFET and a gate electrode of the second N type MOSFET,
the drain electrode of the second P type MOSFET is connected to a gate electrode of the first N type MOSFET and a drain electrode of the second N type MOSFET,
source electrodes of the first N type MOSFET and the second N type MOSFET are connected to a drain electrode of the third N type MOSFET,
a source electrode of the third N type MOSFET is connected to a ground terminal,
a gate electrode of the third N type MOSFET is connected to a constant current circuit,
the drain electrodes of the first and second P type MOSFETs are respectively connected to gate electrodes of the fourth and fifth N type MOSFETs, source electrodes of the fourth and fifth N type MOSFETs are respectively connected to first and second output terminals, the first and second output terminals are respectively connected to output control voltage terminals through the first and second control resistors, drain electrodes of the fourth N type MOSFET and the fifth N type MOSFET are both connected to the ground terminal, and the first and second variable inductors are respectively a semiconductor element described in claim 1.

8. A semiconductor element comprising:

a capacitance variable section provided, over an SOI substrate or in a silicon layer of the SOS substrate, with a variable capacitance diode having first and second control electrodes;

an insulating layer provided over the capacitance variable section; and an inductor section which includes first and second input/output electrodes and first and second control input/output electrodes distinct from said first and second input/output electrodes provided on an upper side of the insulating layer so as to be exposed respectively, and which includes a turbinated spiral electrode for electrically connecting the first input/output electrode and the second input/output electrode, a first control lead-out electrode for electrically connecting between the first control electrode and the first control input/output electrode, and a second control lead-out electrode for electrically connecting between the second control electrode and the second control input/output electrode, all of which are respectively provided within the insulating layer.

9. The semiconductor element according to claim 8, wherein the variable capacitance diode is a PN junction diode.

10. The semiconductor element according to claim 8, wherein the variable capacitance diode is a MOS diode.

11. The semiconductor element according to claim 8, wherein the capacitance variable section includes a fixed capacitance configured by sequentially laminating, over the first control electrode, a first metal electrode electrically connected to the first control electrode, an insulator layer and a second metal electrode electrically connected to the second control electrode.

12. The semiconductor element according to claim 8, wherein the capacitance variable section includes a fixed capacitance configured by sequentially stacking, over the first control electrode, a first polycrystalline silicon electrode electrically connected to the first control electrode, an insulator layer, and a second polycrystalline silicon electrode electrically connected to the second control electrode.

13. A high frequency integrated circuit comprising:

a first-stage cascode amplifying section configured so as to include first and second N type MOSFETs, a first inductor, an input capacitor, a first output capacitor, first and second variable inductors and a first resistive component; and a differential cascode amplifying section configured so as to include third, fourth, fifth and sixth N type MOSFETs, second third and fourth inductors, second and third output capacitors, third, fourth, fifth and sixth variable inductors, and second and third resistive components, wherein in the first-stage cascode amplifying section, a drain electrode of the first N type MOSFET is connected to a source electrode of the second N type MOSFET, a drain electrode of the second N type MOSFET is connected to a power supply terminal through the first inductor and further connected to the first output capacitor, a gate electrode of the second N type MOSFET is connected to the power supply terminal, a source electrode of the first N type MOSFET is connected to a ground terminal through the second variable inductor, the first resistive component comprises first and second resistive elements connected in series at a first connecting point between the power supply terminal and the ground terminal, a gate electrode of the first N type MOSFET is connected to the first connecting point between the first and second resistive elements through the first variable inductor, and an input terminal is connected to the first connecting point through the input capacitor, and wherein in the differential cascode amplifying section, a drain electrode of the third N type MOSFET is connected to a source electrode of the fourth N type MOSFET, a drain electrode of the fourth N type MOSFET is connected to the power supply terminal through the second inductor and further connected to a first output terminal through the second output capacitor, a gate electrode of the fourth N type MOSFET is connected to the power supply terminal, a source electrode of the third N type MOSFET is connected to a source electrode of the fifty N type MOSFET through the fourth and sixth variable inductors connected in series, the second resistive component comprises third and fourth resistive elements connected in series between the power supply terminal and the ground terminal, a gate electrode of the third N type MOSFET is connected to a second connecting point between the third and fourth resistive elements through the third variable inductor, a drain electrode of the fifth N type MOSFET is connected to a source electrode of the sixth N type MOSFET, a drain electrode of the sixth N type MOSFET is connected to the power supply terminal through the third inductor and further connected to a second output terminal through the third output capacitor, a gate electrode of the sixth N type MOSFET is connected to the power supply terminal, the third resistive component comprises fifth and sixth resistive elements connected in series between the power supply terminal and the ground terminal, a gate electrode of the fifth N type MOSFET is connected to a third connecting point between the fifth and sixth resistive elements through the fifth variable inductor, a fourth connecting point between the fourth and sixth variable inductors is connected to the ground terminal through a parallel circuit of the fourth inductor and a capacitor, and the second connecting point is connected to the first output capacitor, and the first, second, third, fourth, fifth and sixth variable inductors are respectively a semiconductor element described in claim 8.

14. A high frequency integrated circuit comprising:
first and second P type MOSFETs;
first, second, third, fourth and fifth N type MOSFETs;
an inductor;
a capacitor; and
first and second control resistors,
wherein source electrodes of the first P type MOSFET and the second P type MOSFET are connected to a power supply terminal,
a drain electrode of the first P type MOSFET is connected to a gate electrode of the second P type MOSFET,
a drain electrode of the second P type MOSFET is connected to a gate electrode of the first P type MOSFET,
the inductor and the capacitor are connected in parallel between the drain electrode of the first P type MOSFET and the drain electrode of the second P type MOSFET,
the inductor comprises a fist variable inductor and a second variable inductor connected in series,
the capacitor comprises a first variable capacitor and a second variable capacitor connected in series and includes a control voltage terminal connected to a connecting point of the first and second variable capacitors,
the drain electrode of the first P type MOSFET is connected to a drain electrode of the first N type MOSFET and a gate electrode of the second N type MOSFET,
the drain electrode of the second P type MOSFET is connected to a gate electrode of the first N type MOSFET and a drain electrode of the second N type MOSFET,
source electrodes of the first N type MOSFET and the second N type MOSFET are connected to a drain electrode of the third N type MOSFET,
a source electrode of the third N type MOSFET is connected to a ground terminal,
a gate electrode of the third N type MOSFET is connected to a constant current circuit,
the drain electrodes of the first and second P type MOSFETs are respectively connected to gate electrodes of the fourth and fifth N type MOSFETs,
source electrodes of the fourth and fifth N type MOSFETs are respectively connected to first and second output terminals,
the first and second output terminals are respectively connected to output control voltage terminals through the first and second control resistors,
drain electrodes of the fourth N type MOSFET and the fifth N type MOSFET are both connected to the ground terminal, and
the first and second variable inductors are respectively a semiconductor element described in claim 8.

* * * * *